United States Patent
Makiyama

(10) Patent No.: US 10,008,572 B2
(45) Date of Patent: Jun. 26, 2018

(54) COMPOUND SEMICONDUCTOR DEVICE, POWER SUPPLY UNIT, AND AMPLIFIER

(71) Applicant: FUJITSU LIMITED, Kawasaki-shi, Kanagawa (JP)

(72) Inventor: Kozo Makiyama, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days. days.

(21) Appl. No.: 15/685,189

(22) Filed: Aug. 24, 2017

(65) Prior Publication Data
US 2018/0090575 A1    Mar. 29, 2018

(30) Foreign Application Priority Data
Sep. 29, 2016 (JP) .................................. 2016-191600

(51) Int. Cl.
| | |
|---|---|
| H01L 29/20 | (2006.01) |
| H01L 29/10 | (2006.01) |
| H01L 29/417 | (2006.01) |
| H01L 29/423 | (2006.01) |
| H01L 29/778 | (2006.01) |
| H01L 29/66 | (2006.01) |

(52) U.S. Cl.
CPC ...... *H01L 29/2003* (2013.01); *H01L 29/1066* (2013.01); *H01L 29/41725* (2013.01); *H01L 29/42376* (2013.01); *H01L 29/66431* (2013.01); *H01L 29/7786* (2013.01); *H01L 2224/48257* (2013.01)

(58) Field of Classification Search
CPC ............ H01L 29/2003; H01L 29/1066; H01L 29/41725
See application file for complete search history.

(56) References Cited

U.S. PATENT DOCUMENTS

| | | | |
|---|---|---|---|
| 9,755,061 B2* | 9/2017 | Ozaki ................ | H01L 29/7786 |
| 9,831,310 B2* | 11/2017 | Kotani ............... | H01L 29/2003 |
| 2013/0075786 A1* | 3/2013 | Ishiguro ............. | H01L 29/7783 257/194 |
| 2013/0256682 A1 | 10/2013 | Ishiguro et al. | |

(Continued)

FOREIGN PATENT DOCUMENTS

| | | |
|---|---|---|
| JP | 2013-074211 | 4/2013 |
| JP | 2013-206976 | 10/2013 |

*Primary Examiner* — Errol Fernandes
(74) *Attorney, Agent, or Firm* — Fujitsu Patent Center

(57) ABSTRACT

A compound semiconductor device disclosed herein includes: a substrate; an electron transit layer formed on the substrate and made of nitride semiconductor doped with an impurity that forms a trap level; a barrier layer formed on the electron transit layer; and a source electrode, a drain electrode, and a gate electrode formed over the electron transit layer at a distance from one another, wherein the electron transit layer includes: a first conductivity type region; a second conductivity type region located over the first conductivity region, where the second conductivity type region having an electron concentration higher than an electron concentration of the first conductivity type region; and a third conductivity type region located over the second conductivity type region, where the third conductivity type region having an electron concentration lower than a concentration of the impurity and being in contact with an upper surface of the electron transit layer.

11 Claims, 37 Drawing Sheets

(56) References Cited

U.S. PATENT DOCUMENTS

2015/0034967 A1 2/2015 Ishiguro
2016/0172478 A1* 6/2016 Kotani ................. H01L 29/207
                                                                257/190

* cited by examiner

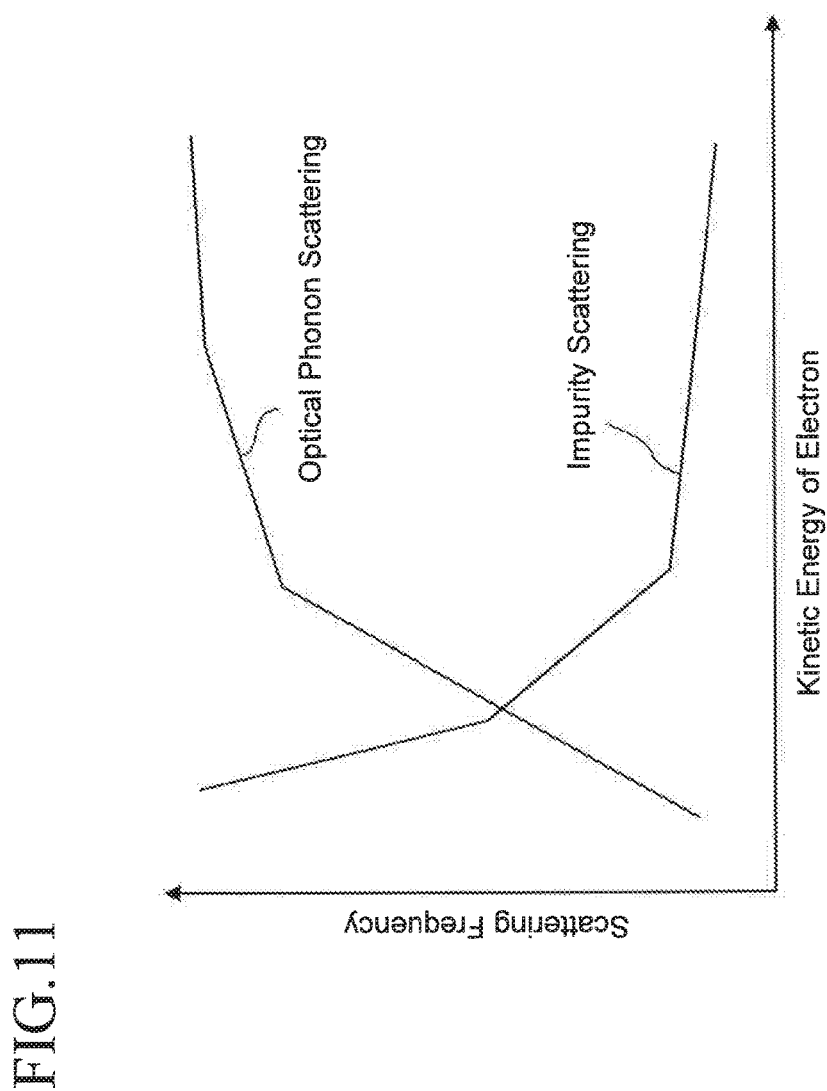

COMPOUND SEMICONDUCTOR DEVICE, POWER SUPPLY UNIT, AND AMPLIFIER

CROSS-REFERENCE TO RELATED APPLICATION(S)

This application is based upon and claims the benefit of priority of the prior Japanese Patent Application No. 2016-191600, filed on Sep. 29, 2016, the entire contents of which are incorporated herein by reference.

FIELD

The embodiments discussed herein are related to a compound semiconductor device, a power supply unit, and an amplifier.

BACKGROUND

There are various types of compound semiconductor devices. Among them, a high electron mobility transistor (HEMT) can easily achieve a higher output as well as a higher frequency, and is used in an application such as a base station for mobile telephones by exploiting these characteristics.

In the HEMT, a two-dimensional electron gas induced in an electron transit layer serves as a carrier. There are various materials for the electron transit layer. For example, when a nitride semiconductor material such as GaN is used as the electron transit layer, a withstand voltage of the HEMT can be enhanced by a large bandgap inherent to the nitride semiconductor.

In order to induce the two-dimensional electron gas in a GaN layer of the electron transit layer, an AlGaN layer with different lattice constant than that of GaN layer and induces the polarization may be formed on the GaN layer. In this case, distortion is generated in the AlGaN layer due to the difference in lattice constant between the AlGaN layer and the GaN layer. Then, by piezoelectric polarization in the AlGaN layer generated due to this distortion and by spontaneous polarization of the AlGaN itself, it is possible to induce the two-dimensional electron gas in the GaN layer of the electron transit layer.

However, in the HEMT device, a short-channel effect occurs in some cases. The short-channel effect is a phenomenon in which threshold voltage decreases and a drain leakage current flows as well, when the gate length is made short. The short-channel effect is one of the factors that prevent the higher output of the HEMT.

Note that techniques related to the present application are disclosed in Japanese Laid-open Patent Publications No. 2013-206976 and No. 2013-74211.

SUMMARY

According to one aspect discussed herein, there is provided a compound semiconductor device including: a substrate; an electron transit layer formed on the substrate and made of nitride semiconductor doped with an impurity that forms a trap level; a barrier layer formed on the electron transit layer; and a source electrode, a drain electrode, and a gate electrode formed over the electron transit layer at a distance from one another, wherein the electron transit layer includes: a first conductivity type region; a second conductivity type region located over the first conductivity region, where the second conductivity type region having an electron concentration higher than an electron concentration of the first conductivity type region; and a third conductivity type region located over the second conductivity type region, where the third conductivity type region having an electron concentration lower than a concentration of the impurity and being in contact with an upper surface of the electron transit layer.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF THE DRAWINGS

FIG. 11 is a schematic diagram illustrating a relation between the kinetic energy of electrons and a scattering frequency of the electrons;

DESCRIPTION OF EMBODIMENTS

Prior to describing embodiments, matters examined by the inventor of the present application will be discussed.

Figure 1:
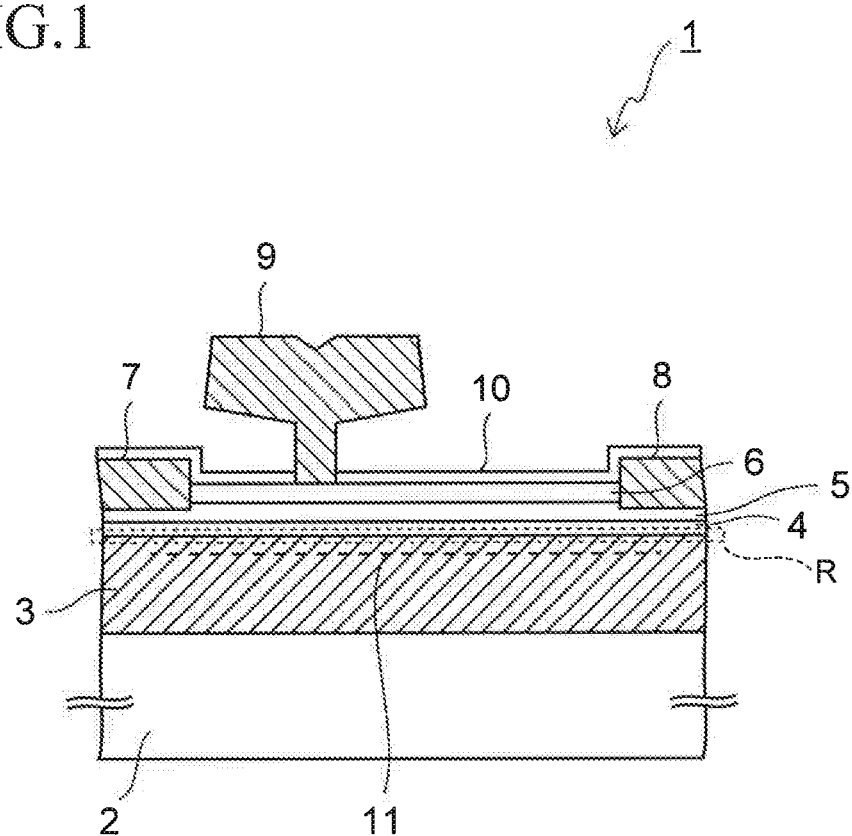
FIG. 1 is a cross-sectional view of a compound semiconductor device used for examination.

FIG. 1 is a cross-sectional view of a compound semiconductor device used for the examination.

This compound semiconductor device 1 is a HEMT, which includes a SiC substrate 2, and a GaN electron transit layer 3 formed thereon.

A source electrode 7 and a drain electrode 8 are formed over the electron transit layer 3 at a distance from each other.

Then, on the electron transit layer 3 between the source electrode 7 and the drain electrode 8, an intermediate layer 4, a barrier layer 5, and a cap layer 6 are formed in this order.

Among them, the intermediate layer 4 has a role of preventing a surface of the electron transit layer 3 from getting rough after forming the electron transit layer 3. In this example, an AlN layer is formed as the intermediate layer 4.

Meanwhile, the barrier layer 5 is an AlGaN layer, which has different lattice constant than that of the electron transit layer 3, and barrier is formed between the AlGaN layer and electron transit layer 3. Piezoelectric polarization and spontaneous polarization are induced due to such a difference in lattice constant, whereby a two-dimensional electron gas 11 is generated in the electron transit layer 3. The two-dimensional electron gas 11 functions as a carrier, and is accumulated in a portion of the electron transit layer 3 located close to the intermediate layer 4.

Meanwhile, the cap layer 6 is provided in order to prevent aluminum contained in the barrier layer 5 from being oxidized and to weaken electric fields. In this example, a GaN layer is formed as the cap layer 6.

In addition, a gate electrode 9 and an insulation layer 10 are formed on the cap layer 6. The insulation layer 10 plays a role of protecting the compound semiconductor device 1 against moisture and the like in the atmosphere. In this example, a silicon nitride film having an excellent moisture-proof function is formed as the insulation layer 10.

Figure 2:
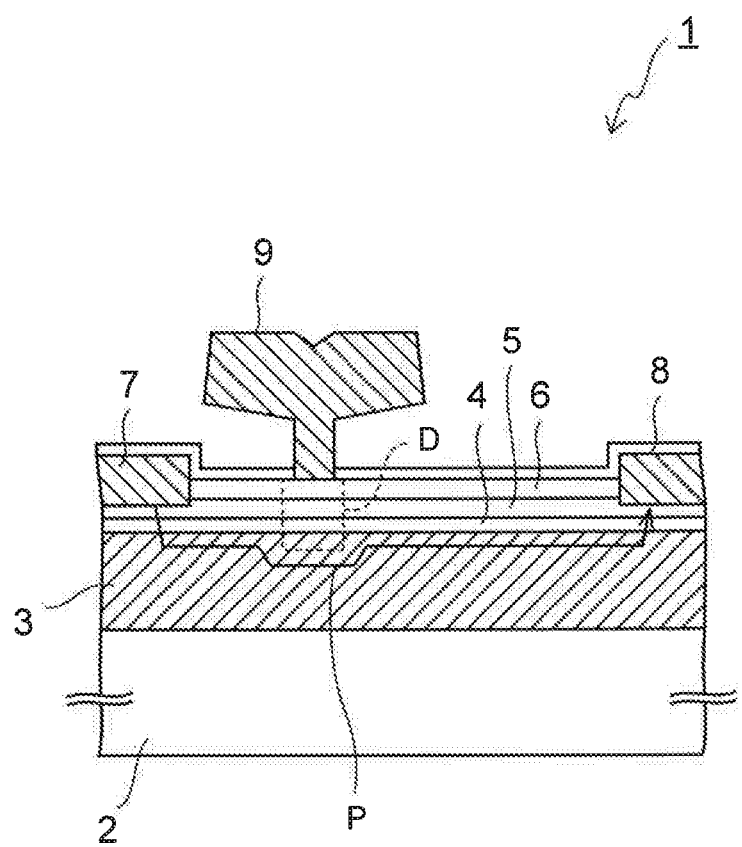
FIG. 2 is a cross-sectional view of the compound semiconductor device in an off-state.

FIG. 2 is a cross-sectional view of the compound semiconductor device 1, which is set to an off-state by applying a negative voltage to the gate electrode 9.

As illustrated in FIG. 2, a depletion layer D spreads below the gate electrode 9 in the off-state. Therefore, even when a voltage is applied between the source electrode 7 and the drain electrode 8, a flow of the carrier in the electron transit layer 3 is blocked by the depletion layer D.

However, since various electric fields are concentrated in a region R (see FIG. 1) located between the electron transit layer 3 and the barrier layer 5, collision ionization significantly occurs. The electric fields causing such a collision ionization include, for example, electric fields concentrated around the depletion layer D, and internal electric fields at an interface between the electron transit layer 3 and the intermediate layer 4. Moreover, the collision ionization is also promoted by crystal defects in the electron transit layer 3.

Holes generated by the collision ionization move toward a deep portion of the electron transit layer 3, whereby a conduction band in the electron transit layer 3 is pushed downward. As a consequence, even when the compound semiconductor device 1 is in the off-state, the electrons easily flow in the deep portion of the electron transit layer 3, thereby creating a leakage path P which bypasses the depletion layer D as illustrated in FIG. 2.

The leakage path P deteriorates a pinch-off characteristic of the compound semiconductor device 1 and causes a short-channel effect.

The short-channel effect occurs prominently when a gate length is short.

The inventor of the present application investigated how short the gate length is to be reduced so as to cause the short-channel effect prominently.

Figure 3:
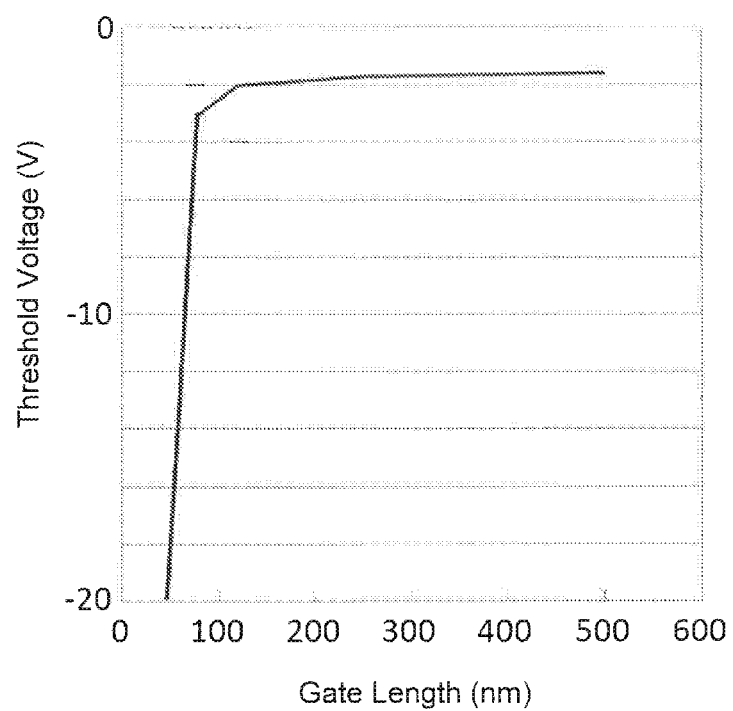
FIG. 3 is a diagram obtained by investigating how small a gate length is to be reduced so as to cause a short-channel effect prominently.

A result of the investigation is illustrated in FIG. 3.

The horizontal axis in FIG. 3 indicates the gate length of the gate electrode 9 and the vertical axis indicates a threshold voltage of a gate voltage required for setting a channel to an on-state.

As illustrated in FIG. 3, the threshold voltage becomes drastically lowered when the gate length is equal to or shorter than 120 nm. Thus, it was revealed that the short-channel effect prominently occurred when the gate length is equal to or shorter than 120 nm.

In order to prevent the short-channel effect, there has also been proposed a method of forming a back barrier layer in the deep portion of the electron transit layer 3. The back barrier layer is a compound semiconductor layer having a conduction band higher than that of the electron transit layer 3. For example, an AlGaN layer is formed as the back barrier layer.

A high barrier of the back barrier layer makes the electrons difficult to reach the deep portion of the electron transit layer 3. Thus, the above-described leakage path P is thought not to occur.

However, the AlGaN layer formed as the back barrier layer has relatively poor crystal quality, and hence electron traps are easily generated in the AlGaN layer. When the electrons are caught by the electron traps, the back barrier layer is charged up. Therefore, the conduction band is raised and an electron concentration is reduced. Eventually, a current collapse phenomenon occurs, in which a drain current is little increased in spite of raising a source-drain voltage.

In the following, embodiments which are capable of suppressing the short-channel effect while preventing the current collapse phenomenon will be described.

First Embodiment

A compound semiconductor device according to a first embodiment will be described while illustrating a manufacturing process thereof.

Figure 4A:
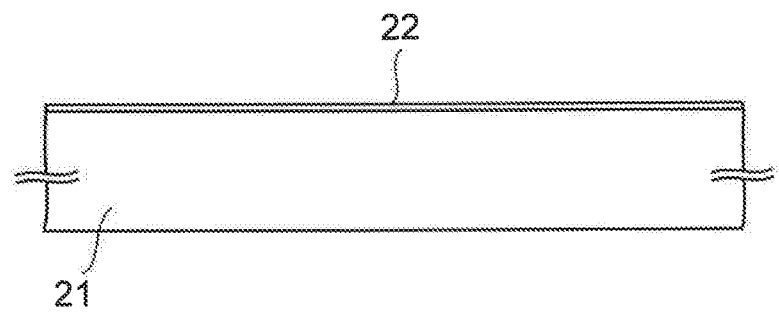
FIGS. 4A to 4P are cross-sectional views in the process of manufacturing a compound semiconductor device according to a first embodiment.
Figure 4B:
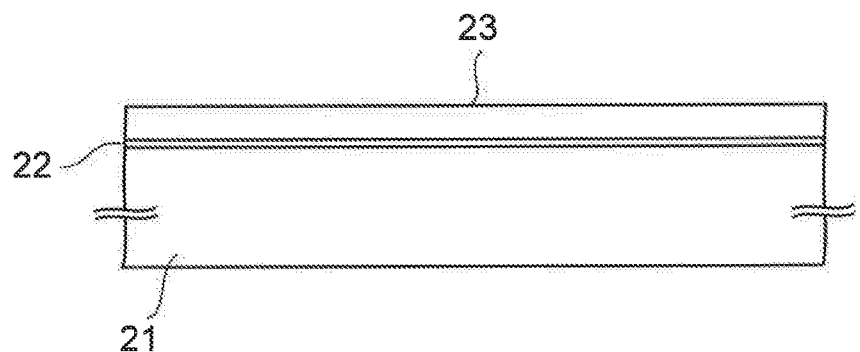
Figure 4C:
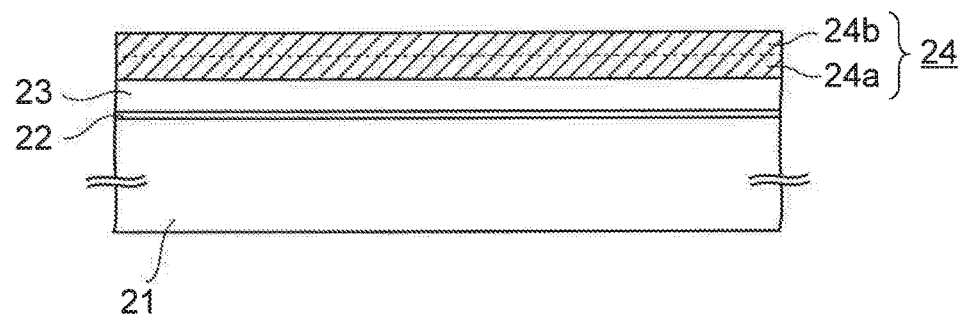
Figure 4D:
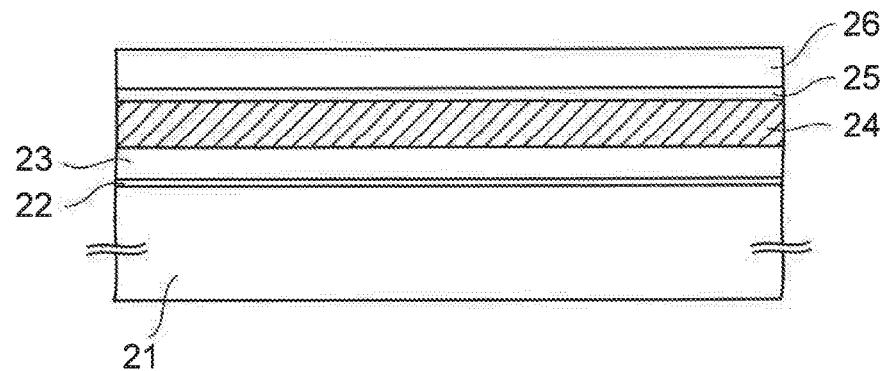
Figure 4E:
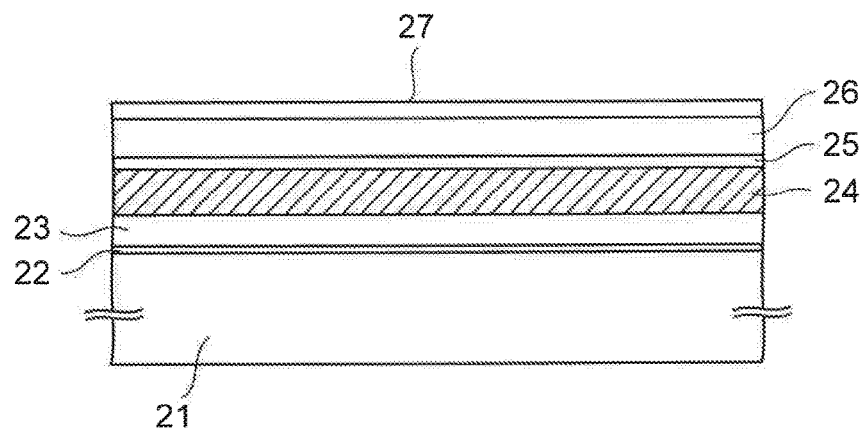
Figure 4F:
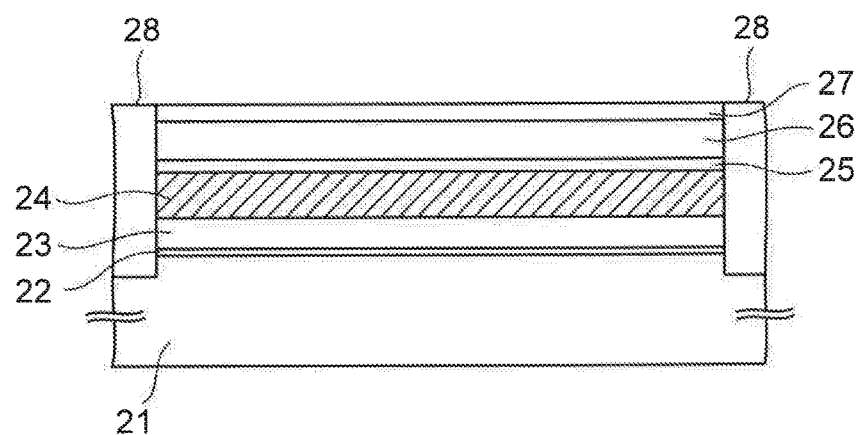
Figure 4G:
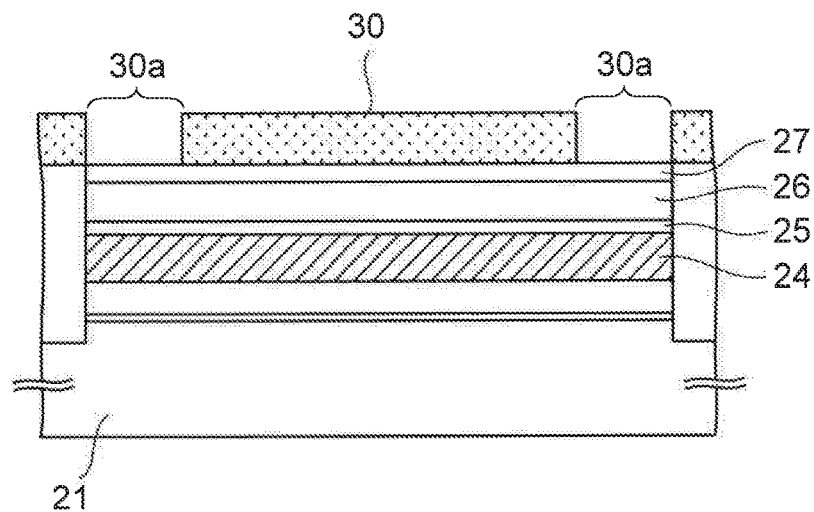
Figure 4H:
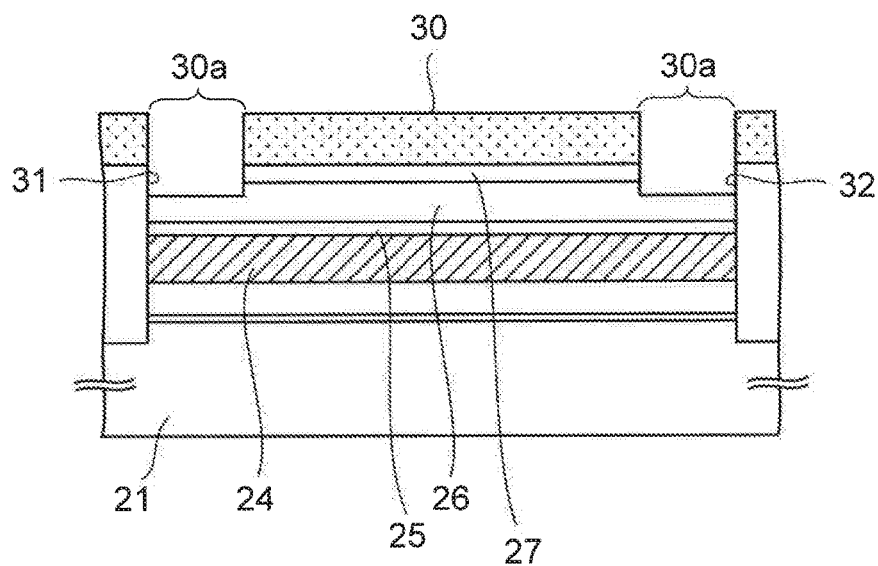
Figure 4I:
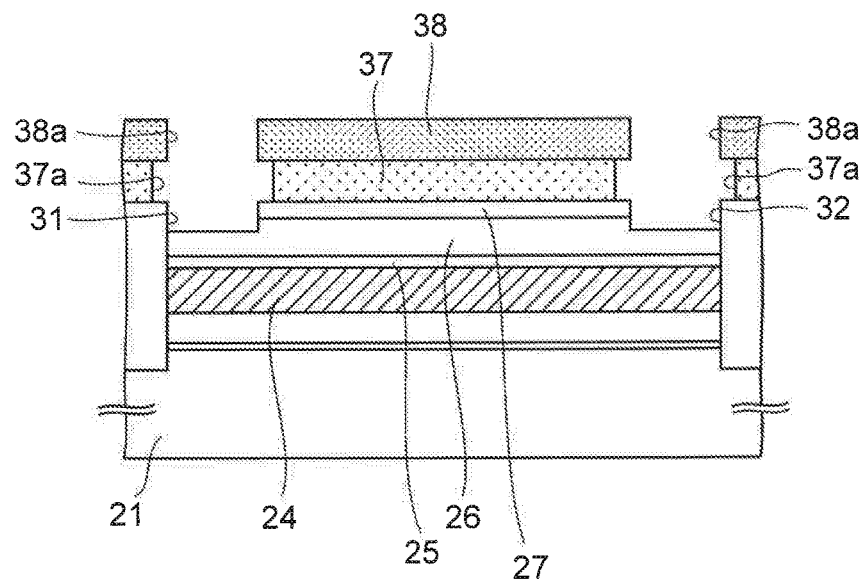
Figure 4J:
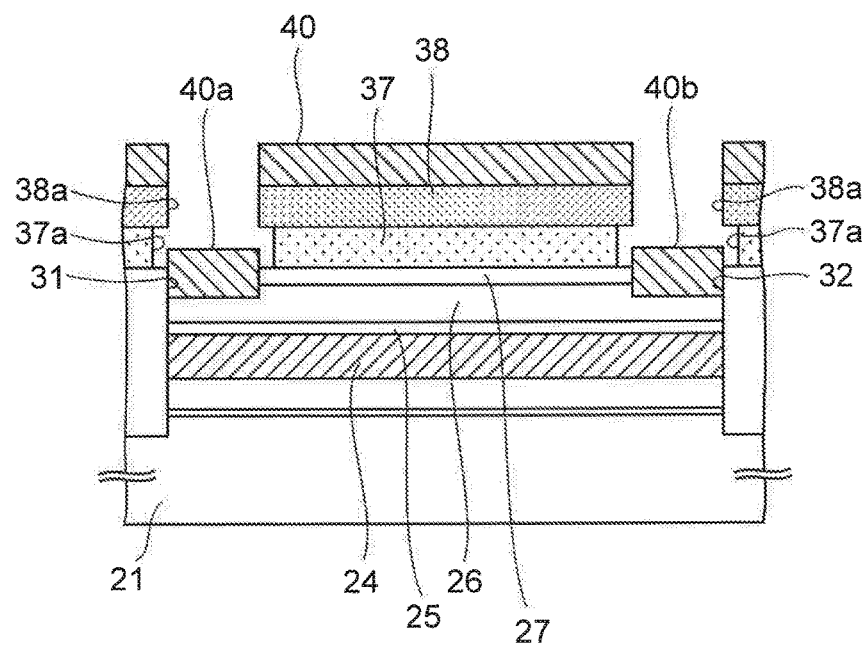
Figure 4K:
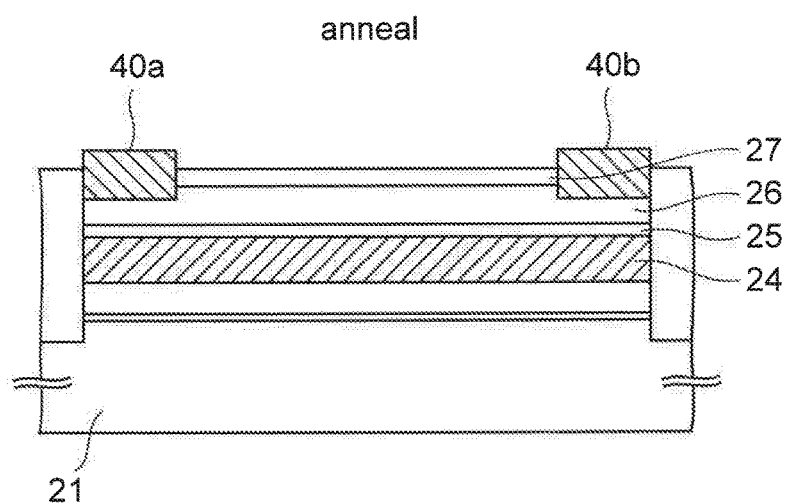
Figure 4L:
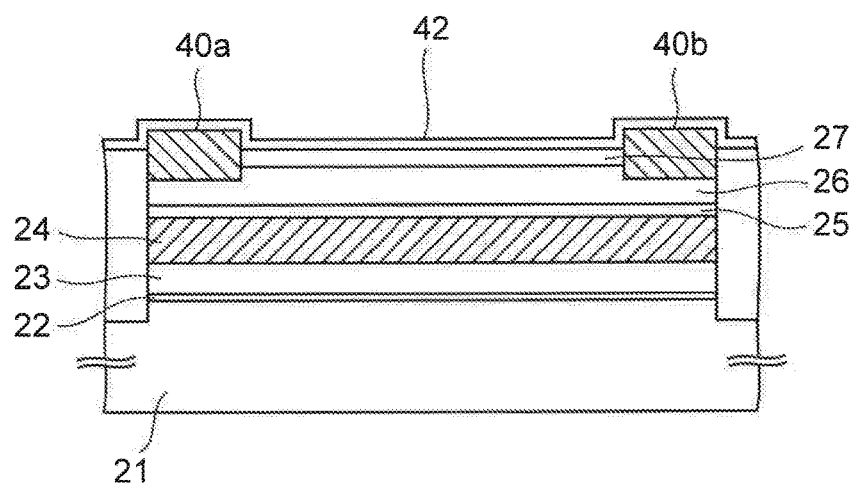
Figure 4M:
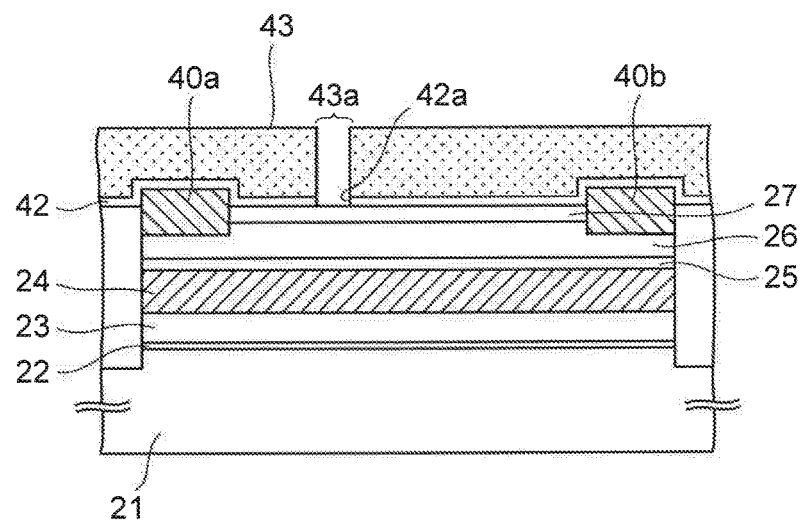
Figure 4N:
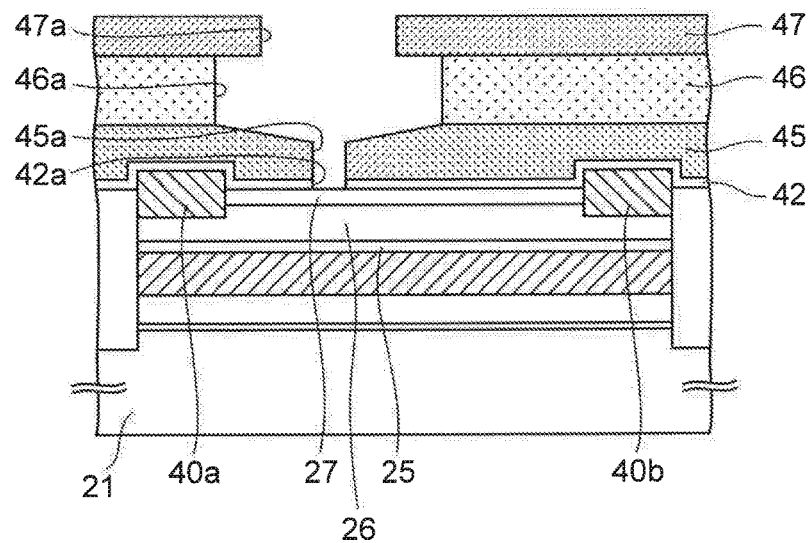
Figure 4O:
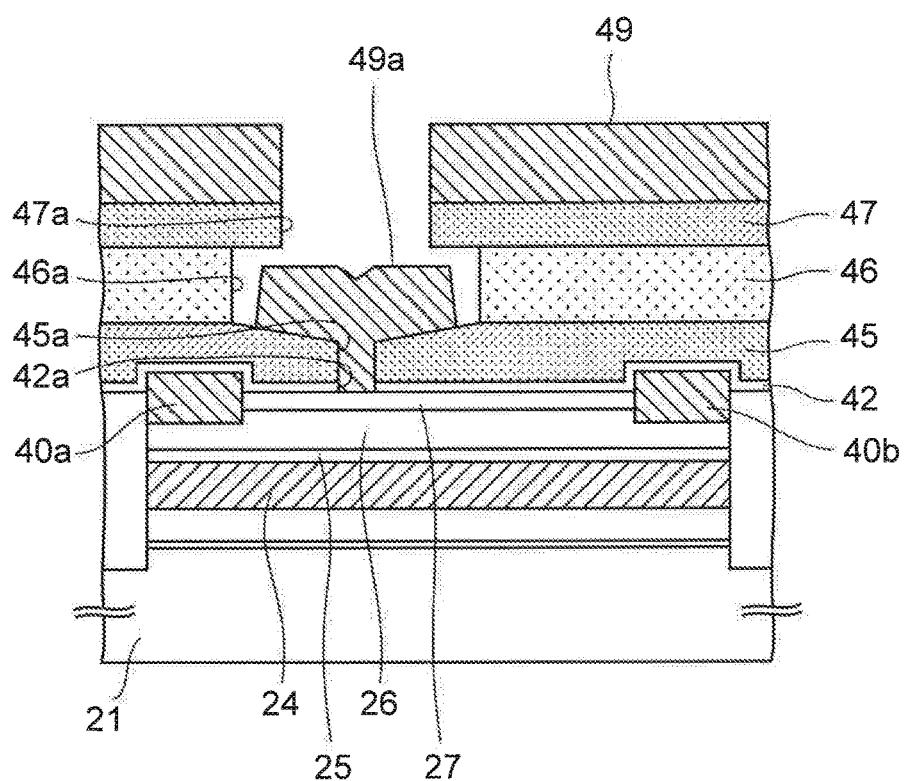
Figure 4P:
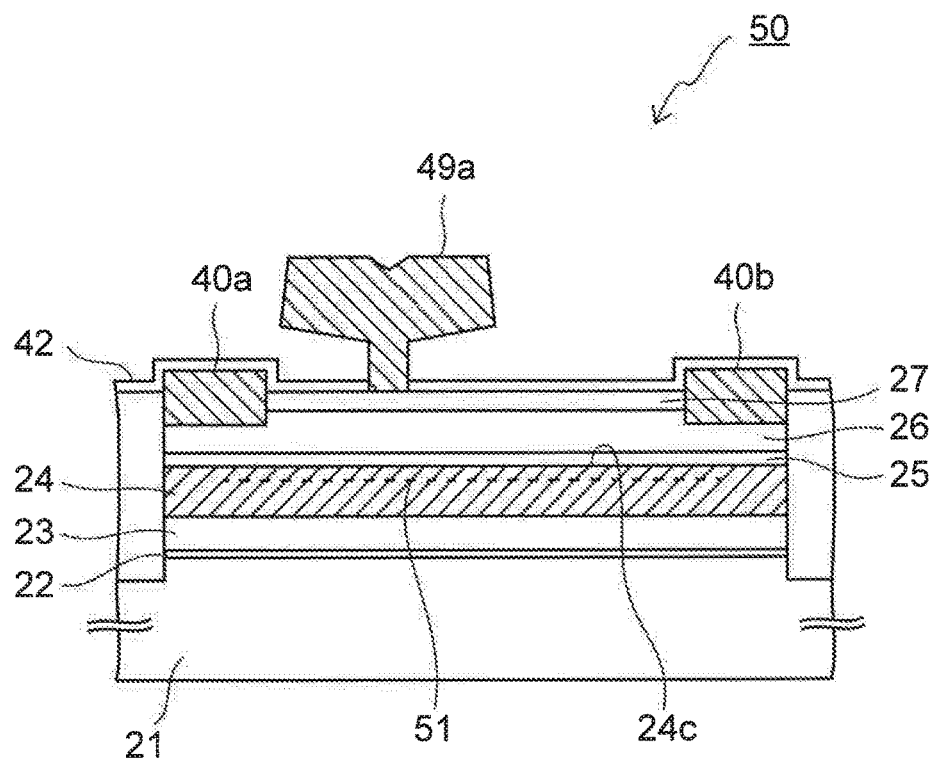

FIGS. 4A to 4P are cross-sectional views in the process of manufacturing the compound semiconductor device of the present embodiment. In the present embodiment, a HEMT is manufactured as the compound semiconductor device as follows.

First, as illustrated in FIG. 4A, a semi-insulating SiC substrate is prepared as a substrate 21, and an AlN layer is formed to a thickness of about 10 nm to 100 nm as a nucleation layer 22 on the substrate 21 by metal organic vapor phase epitaxy (MOVPE) method.

Next, as illustrated in FIG. 4B, in a chamber for the MOVPE method, a GaN layer is formed by the MOVPE method as a buffer layer 23 on the nucleation layer 22, while using the nucleation layer 22 as a nucleus of growth.

The buffer layer 23 is a layer for forming an electron transit layer with fine crystal quality on the substrate 21 by absorbing lattice defects of the substrate 21. The buffer layer 23 is formed to a thickness of about 500 nm to 1000 nm, for example.

Deposition conditions for the buffer layer 23 are not particularly limited. For example, the buffer layer 23 may be formed under conditions of using a mixed gas of trimethylgallium (TMG) gas, ammonia ($NH_3$) gas, and hydrogen ($H_2$) gas as a deposition gas, and setting a substrate temperature to about 1000° C. to 1200° C.

Meanwhile, in this embodiment, a material gas of iron is added to the deposition gas so as to dope the buffer layer 23 with iron, which is an impurity to form a trap level, at a concentration of about $5\times10^{17}$ cm$^{-3}$. Examples of the material gas for doping iron include cyclopentadienyl iron ($Cp_2Fe$).

Note that the impurity is not limited to iron, as long as the impurity forms the trap level. Other than iron, impurities that form the trap level include beryllium and magnesium.

Next, the process for obtaining a cross-sectional structure illustrated in FIG. 4C will be described.

First, while continuously using the above-mentioned chamber, a GaN layer is formed to a thickness of about 200 nm to 500 nm on the buffer layer 23 as a lower portion 24a of an electron transit layer 24 by the MOVPE method, under a condition of setting the substrate temperature to about 1000° C. to 1200° C.

Similar to the buffer layer 23, the deposition gas used in the MOVPE method is the mixed gas of TMG gas, ammonia gas, and hydrogen gas.

In this step as well, the lower portion 24a is doped with iron at a concentration equal to or greater than $5\times10^{15}$ cm$^{-3}$, about $5\times10^{17}$ cm$^{-3}$ for example, by adding cyclopentadienyl iron as the material gas of iron to the deposition gas.

Subsequently, by reducing a flow rate of cyclopentadienyl iron in the above-mentioned chamber, a GaN layer doped with iron at a lower concentration than that of the lower part 24a is formed to a thickness of about 100 nm to 500 nm by the MOVPE method. The GaN layer thus formed is set as an upper portion 24b of the electron transit layer 24.

Although the concentration of iron in the upper portion 24b is not particularly limited, the concentration is set to a lower concentration than that of the lower portion 24a in this embodiment. For example, the concentration of iron in the upper portion 24b is set equal to or greater than $5\times10^{15}$ cm$^{-3}$, about $5\times10^{16}$ cm$^{-3}$ for example.

By making the concentration of iron in the upper portion 24b lower than that of the lower portion 24a in this manner, it is possible to prevent the electron mobility from decreasing, which would otherwise occur due to impurity scattering of iron in upper portion 24b in which the two-dimensional electron gas is induced.

Subsequently, as illustrated in FIG. 4D, an AlN layer is formed to a thickness of about 1 nm on the electron transit layer 24 as an intermediate layer 25 by the MOVPE method, thereby preventing the surface of the electron transit layer 24 from getting rough by the intermediate layer 25.

Thereafter, an AlGaN layer is formed to a thickness of about 5 nm to 15 nm on the intermediate layer 25 as a barrier layer 26 by the MOVPE method. Examples of a deposition gas for the barrier layer 26 include a mixed gas of trimethylaluminum (TMA) gas, TMG gas, ammonia gas, and hydrogen gas.

Here, in order to induce a high-concentration two-dimensional electron gas in the electron transit layer 24 by enhancing spontaneous polarization of the barrier layer 26, an InAlGaN layer may be formed as the barrier layer 26 by mixing trymethylindium (TMI) gas with the above-mentioned deposition gas. The InAlGaN layer is formed at a lower temperature than the temperatures for forming the electron transit layer 24 and the intermediate layer 25.

Next, as illustrated in FIG. 4E, a GaN layer is formed to a thickness of about 1 nm to 10 nm on the barrier layer 26 by the MOVPE method. The GaN layer thus formed is used as a cap layer 27.

By the cap layer 27, it is possible to prevent aluminum contained in the barrier layer 26 from being oxidized by oxygen in the atmosphere, and to weaken an electric field as well.

Subsequently, as illustrated in FIG. 4F, device isolation regions 28 are formed by implanting argon ions from a surface of the cap layer 27 toward the substrate 21, and active regions are defined by the respective device isolation regions 28.

Next, as illustrated in FIG. 4G, a first resist layer 30 is coated on the cap layer 27, and two openings 30a are formed at a distance from each other in the first resist layer 30 by subjecting the first resist layer 30 to exposure and development.

Then, as illustrated in FIG. 4H, the cap layer 27 and part of the barrier layer 26 are subjected to dry etching through the openings 30a, respectively. Thus, a first opening 31 and a second opening 32 each reaching a halfway depth of the barrier layer 26 are formed at a distance from each other.

An etching gas used in this dry etching is not particularly limited. For example, a mixed gas of an inert gas and chlorine ($Cl_2$) gas may be used as the etching gas.

Thereafter, the first resist layer 30 is removed by using a heated organic solvent.

Subsequently, as illustrated in FIG. 4I, a second resist layer 37 and a third resist layer 38 are formed in this order on the entire upper surface of the substrate 21. In this example, PMGI manufactured by MicroChem Corp. is used as a material of the second resist layer 37, and ZEP520 manufactured by Zeon Corporation is used as a material of the third resist layer 38.

Then, after the third resist layer 38 is subjected to exposure to an electron beam, the third resist layer 38 is developed by using ZEP-SD manufactured by Zeon Corporation. Thus, openings 38a are formed over the first opening 31 and the second opening 32, respectively.

Moreover, the second resist layer 37 is subjected to wet etching through the openings 38a. Thus, openings 37a having side surfaces set back from the openings 38a are formed in the second resist layer 37. Examples of an etching solution used in this wet etching include NMD-W manufactured by Tokyo Ohka Kogyo Co., Ltd.

Although the third resist layer 38 is subjected to exposure to the electron beam in this example, an i-line resist layer may be formed as the third resist layer 38 and the third resist layer 38 may be subjected to exposure to the i-line instead. Examples of the i-line resist layer include PFI-32A manufactured by Sumitomo Chemical Co., Ltd.

Subsequently, as illustrated in FIG. 4J, a titanium layer of a thickness of about 20 nm and an aluminum layer of a thickness of about 200 nm are formed in this order by vapor deposition as a metal lamination film 40 on the third resist layer 38 and on the barrier layer 26 exposed from the respective openings 31 and 32.

Thereafter, the second resist layer 37 and the third resist layer 38 are lifted off. In this way, portions of the metal lamination film 40 formed in the respective openings 31 and 32 constitute a source electrode 40a and a drain electrode 40b arranged at a distance from each other.

At this time, since the side surfaces of the openings 37a are set back from the openings 38a as mentioned previously, it is possible to separate the source electrode 40a and the drain electrode 40b from the metal lamination film 40 on the third resist layer 38, and thus to prevent the metal lamination film 40 from being left after the liftoff.

Next, as illustrated in FIG. 4K, the source electrode 40a and the drain electrode 40b are heated under a condition of setting the substrate temperature to about 550° C. in a nitrogen atmosphere. Thus, the material of the source electrode 40a and the drain electrode 40b is diffused into the electron transit layer 24, so that the source electrode 40a and the drain electrode 40b can be brought into ohmic contact with the electron transit layer 24, respectively.

Subsequently, as illustrated in FIG. 4L, a silicon nitride layer of a thickness of about 50 nm is formed on the source electrode 40a, the drain electrode 40b, and the cap layer 27 as an insulation layer 42 for protecting a surface of a device against moisture in the atmosphere. This silicon nitride layer has a stoichiometric composition and its refraction index is about 2.0 with respect to light at a wavelength of 633 nm.

In the meantime, the silicon nitride layer may be formed by plasma CVD method which uses silane ($SiH_4$) gas and ammonia gas as a deposition gas, for example.

Next, as illustrated in FIG. 4M, PMMA manufactured by MicroChem Corp. is coated as a fourth resist layer 43 on the insulation layer 42, and is subjected to exposure to an electron beam and then developed. In this way, an opening 43a having a diameter of about 0.1 μm is formed in the fourth resist layer 43.

Then, the insulation layer 42 is subjected to dry etching through the opening 43a while using $SF_6$ gas as an etching gas. Thus, an opening 42a is formed in a portion of the insulation layer 42 between the source electrode 40a and the drain electrode 40b such that the cap layer 27 is exposed from the opening 42a.

Thereafter, the fourth resist layer 43 is removed.

Subsequently, as illustrated in FIG. 4N, fifth to seventh resist layers 45 to 47 are formed in this order on the insulation layer 42.

Materials of the respective resist layers 45 to 47 are not particularly limited. In this example, PMMA manufactured by MicroChem Corp. is used as a material of the fifth resist layer 45, and PMGI manufactured by MicroChem Corp. is used as a material of the sixth resist layer 46. Moreover, ZEP520 manufactured by Zeon Corporation is used as a material of the seventh resist layer 47.

Then, after the seventh resist layer 47 is subjected to exposure to an electron beam, the seven resist layer 47 is developed by using the developer ZEP-SD manufactured by Zeon Corporation. Thus, an opening 47a having a width of about 0.8 μm is formed in the seventh resist layer 47.

Thereafter, the sixth resist layer 46 is subjected to wet etching through the opening 47a. Thus, an opening 46a having a side surface set back by 0.5 μm from the opening 47a is formed in the sixth resist layer 46. As an etching solution in this wet etching, NMD-W manufactured by Tokyo Ohka Kogyo Co., Ltd. is used for example.

Furthermore, after the fifth resist layer 45 exposed from the opening 46a is subjected to exposure to an electron beam, the fifth resist layer 45 is developed by using a developer ZMD-B manufactured by Zeon Corporation. Thus, an opening 45a having a diameter of about 0.15 μm is formed over the opening 42a.

Next, as illustrated in FIG. 4O, a nickel layer of a thickness of about 10 nm and a gold layer of a thickness of about 300 nm are formed in this order by vapor deposition as a metal lamination film 49 on the seventh resist layer 47.

The metal lamination film 49 is also formed in the opening 45a as well as the respective openings 46a and 47a. Thus, a gate electrode 49a having a shape of a mushroom is formed on the cap layer 27 exposed from the opening 42a and at a distance from the source electrode 40a and the drain electrode 40b.

Thereafter, as illustrated in FIG. 4P, the respective resist layers 45 to 47 are dissolved and removed by using a heated organic solvent.

In this way, a basic structure of a compound semiconductor device 50 of the present embodiment is obtained.

In this compound semiconductor device 50, a two-dimensional electron gas 51 is generated as a carrier in the electron transit layer 24 by piezoelectric polarization and spontaneous polarization of the barrier layer 26.

Figure 5:
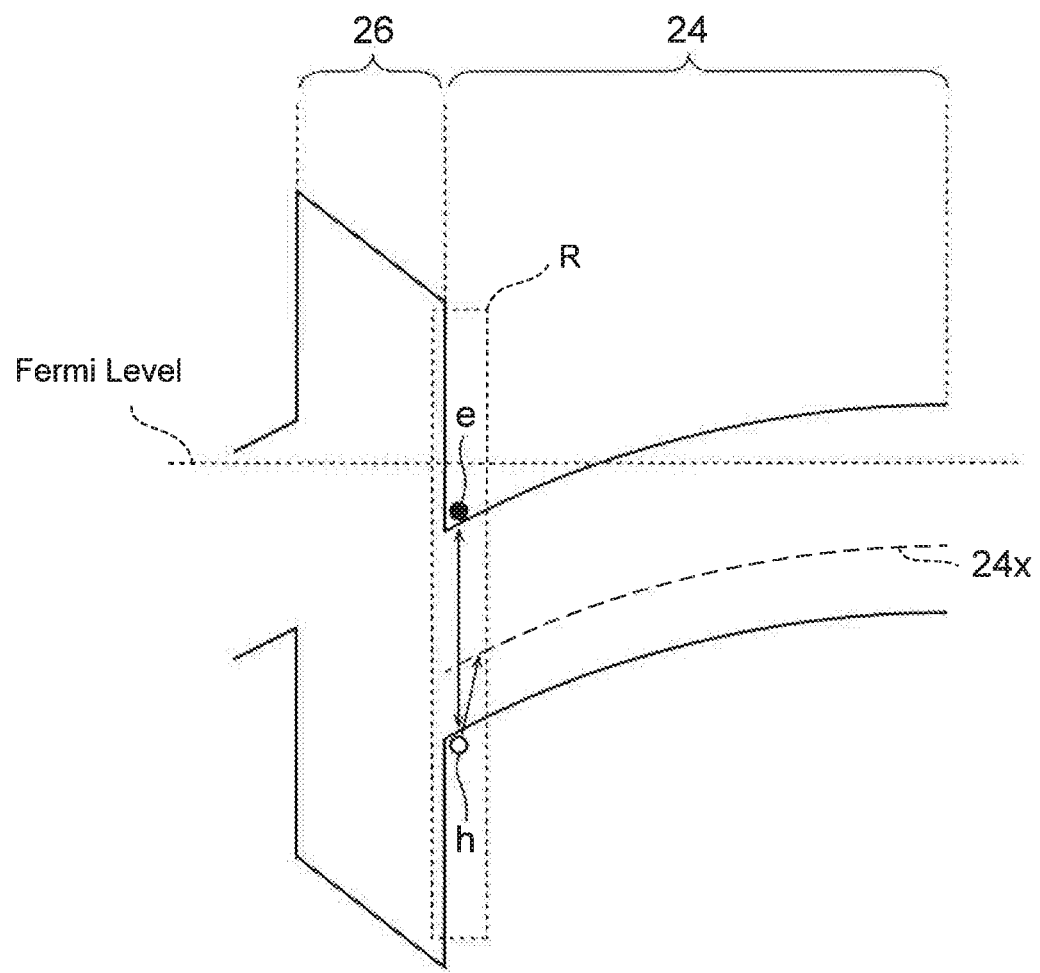
FIG. 5 is a diagram illustrating a band structure of the compound semiconductor device according to the first embodiment.

FIG. 5 is a diagram illustrating a band structure of the compound semiconductor device 50. Note that the intermediate layer 25 is omitted in FIG. 5 in order to simplify the explanation.

As illustrated in FIG. 5, since the electron transit layer 24 is doped with iron in the present embodiment, a trap level 24x of iron is formed in the electron transit layer 24. Therefore, even when electrons e and holes h are generated due to collision ionization occurring in a region R at the vicinity of an interface between the electron transit layer 24 and the barrier layer 26 by the concentration of electric fields, the holes h are trapped by the trap level 24x and do not reach a deep portion of the electron transit layer 24.

As a consequence, a conduction band in the electron transit layer 24 is not put downward by the holes h. Accordingly, the electrons are less likely to flow in the deep portion of the electron transit layer 24. Thus, a pinch-off characteristic of the compound semiconductor device 50 can be improved by suppressing a short-channel effect.

In particular, as illustrated in FIG. 3, the short-channel effect appears prominently when the gate length is equal to or shorter than 120 nm. Accordingly, a practical advantage of preventing the short-channel effect by doping the electron transit layer 24 with the impurity is particularly high in the case where the gate length is equal to or shorter than 120 nm.

Moreover, since a back barrier layer made of an AlGaN layer is not formed in the present embodiment, it is possible to suppress the current collapse phenomenon that is otherwise would occur due to electron traps generated in the back barrier layer.

The inventor of the present application measured three-terminal characteristics of the compound semiconductor device 50 of the present embodiment in order to verify that the current collapse phenomenon is actually suppressed.

A result of measurement will be described with reference to FIGS. 6A and 6B.

Figure 6A:
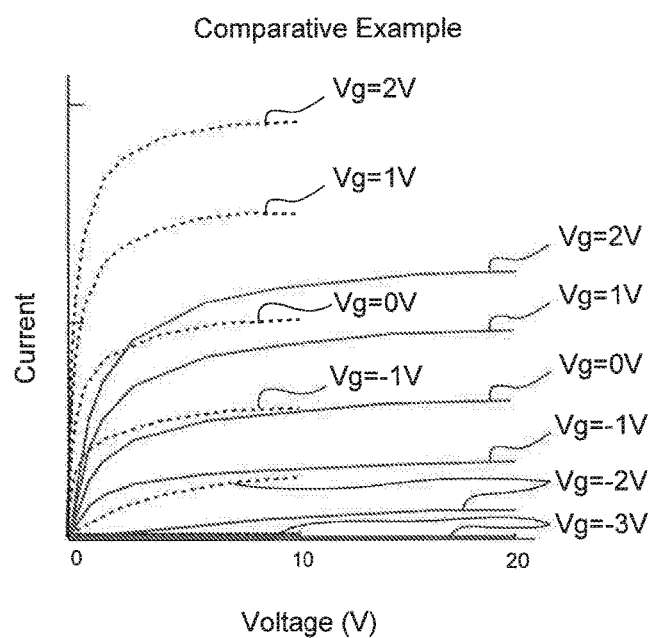
FIG. 6A is a diagram obtained by measuring three-terminal characteristics of a compound semiconductor device according to a comparative example.

FIG. 6A is a diagram obtained by using the compound semiconductor device 1 in FIG. 1 as a comparative example and measuring three-terminal characteristics of the comparative example.

The horizontal axis in FIG. 6A indicates a source-drain voltage and the vertical axis indicates a drain current. This is also the case for FIG. 6B to be described later.

As illustrated in FIG. 6A, when comparing with the same gate voltage Vg, on-resistance and a maximum current in the case where the source-drain voltage is raised to 20 V (solid lines) are smaller than those in the case where the source-drain voltage is raised to 10 V (dotted lines), which indicates that current collapse phenomenon occurs in the comparative example.

Figure 6B:
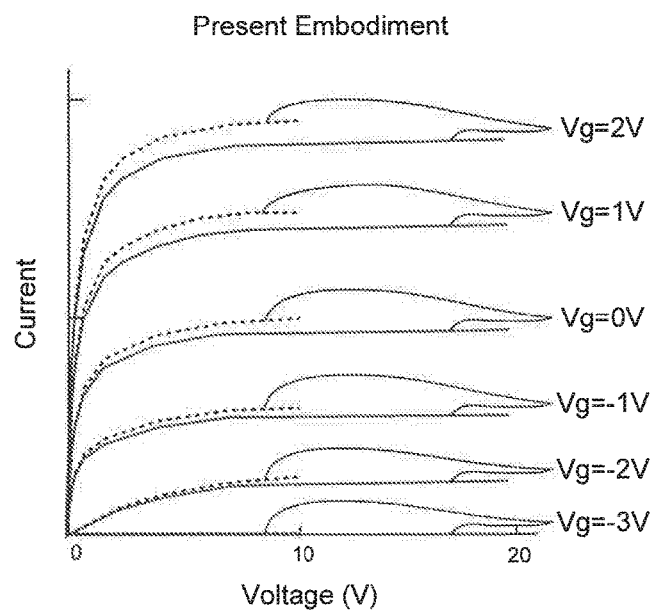
FIG. 6B is a diagram obtained by measuring three-terminal characteristics of the compound semiconductor device according to the first embodiment.

Meanwhile, FIG. 6B is a diagram obtained by measuring three-terminal characteristics of the compound semiconductor device 50 of the present embodiment.

As illustrated in FIG. 6B, when comparing with the same gate voltage Vg, on-resistance and a maximum current in the case where the source-drain voltage is raised to 20 V (solid lines) are substantially equal to those in the case where the source-drain voltage is raised to 10 V (dotted lines) in the present embodiment, which indicates that the current collapse phenomenon is suppressed.

According to this result, it is confirmed that the current collapse phenomenon is suppressed in the present embodiment.

The inventor of the present application also investigated a relation between a gate-source voltage Vgs and a drain current Ids of the compound semiconductor device 50, in order to confirm that the short-channel effect is suppressed by doping the electron transit layer 24 with iron as described above.

Figure 7:
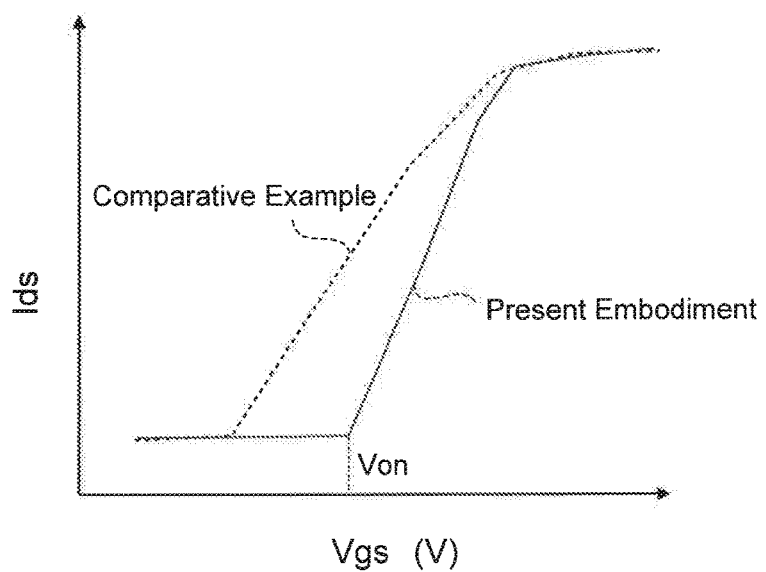
FIG. 7 is a graph obtained by investigating a relation between a gate-source voltage and a drain current of the compound semiconductor device according to the first embodiment.

FIG. 7 is a graph obtained by the investigation.

Note that in FIG. 7, the compound semiconductor device 1 in FIG. 1 is used as the comparative example, and a relation between a gate-source voltage Vgs and a drain current Ids of the comparative example is indicated as well.

As illustrated in FIG. 7, it was revealed that in the present embodiment, a voltage Von at which the transistor becomes an on-state is higher than that in the comparative example. This is because leakage current does not flow between the source and the drain at a voltage lower than the voltage Von and the channel is in a pinch-off state.

Thus, it was confirmed that the short-channel effect is actually suppressed by doping iron into the electron transit layer 24 as in the present embodiment. Therefore, the drain current Ids can be greatly changed by slightly changing the gate-source voltage Vgs, which in turn makes it possible to increase the amplification factor of the compound semiconductor device 50.

Next, a conductivity type of the electron transit layer 24 will be explained.

Figure 8:
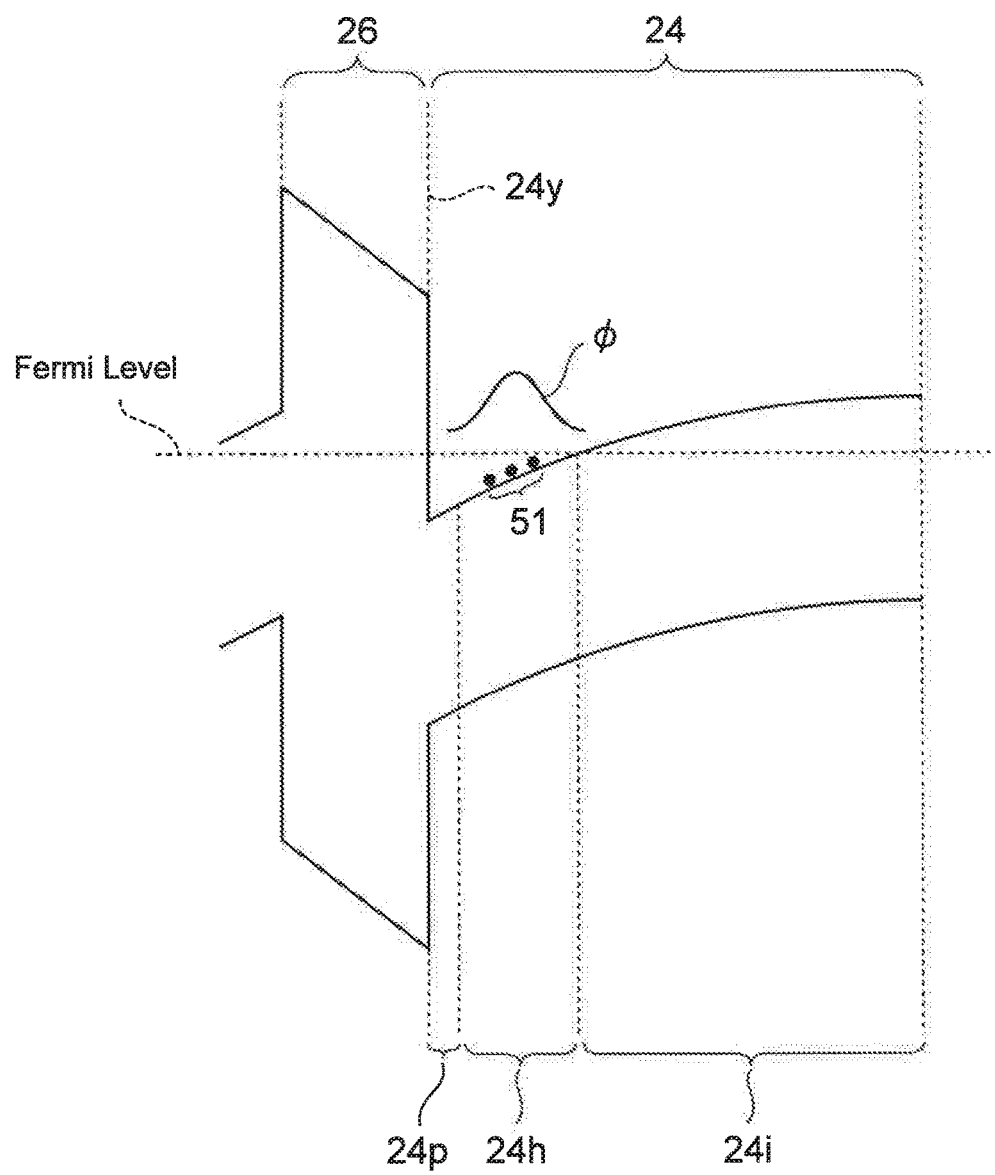
FIG. 8 is a diagram illustrating a band structure for explaining a conductivity type of an electron transit layer according to the first embodiment.

FIG. 8 is a diagram illustrating a band structure for explaining the conductivity type of the electron transit layer 24. Note that the intermediate layer 25 is omitted in FIG. 8 in order to simplify the explanation.

The conductivity type of the electron transit layer 24 is determined by an electron concentration and the concentration of the impurity that forms the trap level. For example, the conductivity type becomes an n-type in a region where the electron concentration is higher than the concentration of the impurity. Also, the conductive type becomes a very week p-type in a region where the electron concentration is lower than the concentration of the impurity.

The electron concentration in the electron transit layer 24 is determined by a wave function $\varphi$ of the two-dimensional electron gas 51. Since a peak of the wave function $\varphi$ is located at a position slightly deeper than an upper surface 24y of the electron transit layer 24, the electrons are deficient in the vicinity of the upper surface 24y.

Therefore, a portion of the electron transit layer 24 that contacts with the upper surface 24y becomes a very weak p-type region 24p where the concentration of the impurity is slightly higher than the electron concentration. Note that the very weak p-type region 24p is an example of a third conductivity type region.

Meanwhile, in the electron transit layer 24 under the p-type region 24p, the peak of the electron wave function $\varphi$ is located and thus the concentration of the two-dimensional electron gas 51 is high, and hence an n-type region 24n where the electron concentration is higher than the concentration of the impurity is formed. The n-type region 24n is an example of a second conductivity type region.

Moreover, in the electron transit layer 24 under the n-type region 24n, the conduction band becomes higher than a Fermi level and thus an i-type region 24i with little electrons in the conduction band is formed. Note that the i-type region 24i is an example of a first conductivity type region.

Meanwhile, since only a few electrons are present in the i-type region 24i, the electron concentration of the n-type region 24n becomes higher than that of the i-type region 24i.

Here, the electron concentration in the i-type region 24i is equal to lower than $1\times10^{16}$ cm$^{-3}$, while the concentration of iron in the i-type region 24i is equal to or greater than $5\times10^{15}$ cm$^{-3}$.

In this manner, the electron transit layer 24 of the present embodiment includes the i-type region 24i, the n-type region 24n, and the very weak p-type region 24p in sequence from below.

Among them, the very weak p-type region 24p has a role of trapping the holes generated by the collision ionization, and the p-type region 24p cannot trap all of the holes when the concentration of iron contained in the p-type region 24p is low.

In order to investigate how many holes are generated by the collision ionization, the inventor of the present application simulated the density of ions generated by the collision ionization.

Figure 9A:
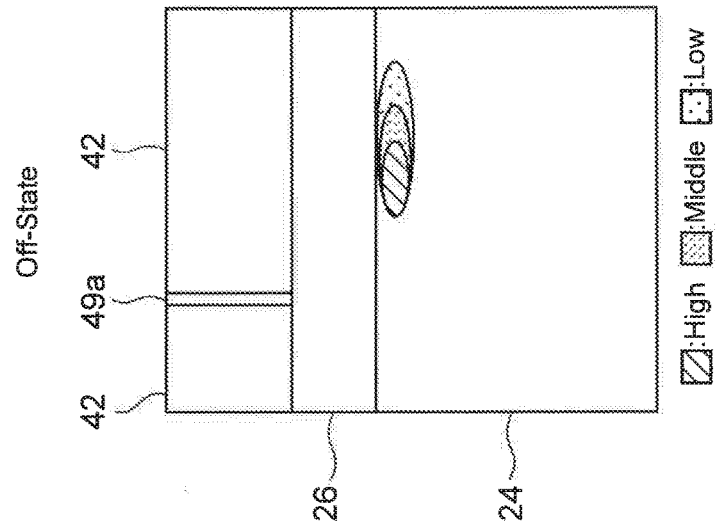
FIGS. 9A and 9B are views illustrating a simulation result of densities of ions caused by collision ionization.
Figure 9B:
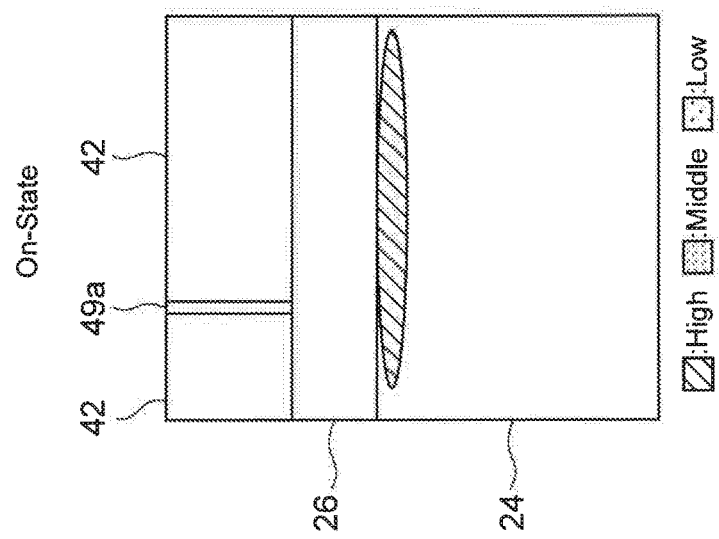

A result of the simulation is illustrated in FIGS. 9A and 9B.

Note that the intermediate layer 25 and the cap layer 27 are omitted in this simulation in order to simplify calculations. Meanwhile, FIGS. 9A and 9B are provided with hatched portions of "High", "Middle", and "Low", corresponding to higher to lower densities of ions respectively.

FIG. 9A is a cross-sectional view illustrating a simulation result of densities of ions when the channel is in an on-state.

As illustrated in FIG. 9A, many ions are generated on a surface layer of the electron transit layer 24 in the on-state.

On the other hand, FIG. 9B is a cross-sectional view illustrating a simulation result of densities of ions when the channel is in an off-state.

As illustrated in FIG. 9B, even in the off-state, ions are generated on the surface layer of the electron transit layer 24 due to the collision ionization.

According to the estimation of the inventor of the present embodiment, the most of the hole generated in the collision ionization can be trapped by the trap level of iron by making the iron concentration in the surface layer 24c (see FIG. 4P) of the electron transit layer 24 equal to or greater than $5 \times 10^{16}$ cm$^{-3}$.

Meanwhile, when the electron transit layer 24 is doped with iron as described above, the iron causes impurity scattering whereby electron mobility in the electron transit layer 24 may be lowered.

Figure 10A:
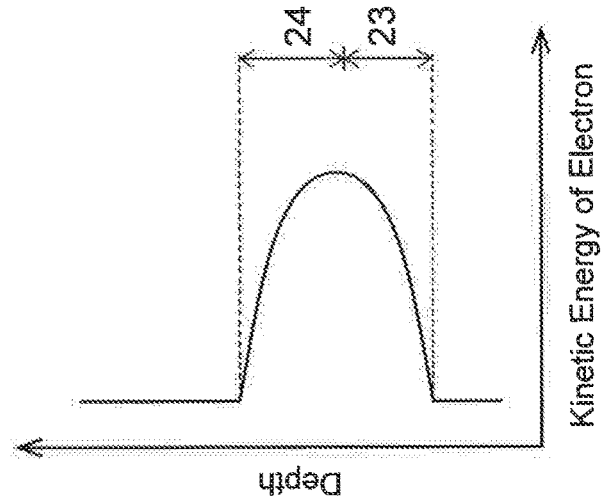
FIG. 10A is a schematic diagram illustrating a concentration profile of iron in the compound semiconductor device according to the first embodiment.
Figure 10B:
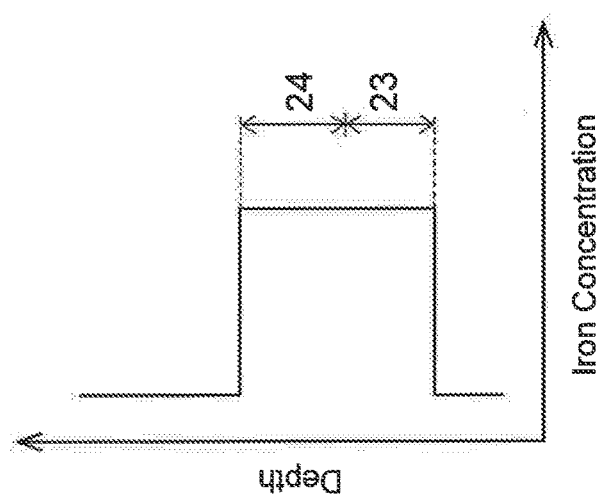
FIG. 10B is a schematic diagram illustrating kinetic energy of electrons in the compound semiconductor device according to the first embodiment in an on-state.

FIGS. 10A and 10B are schematic diagrams for explaining the influences of iron on the electron mobility.

Of these drawings, FIG. 10A is a schematic diagram illustrating a concentration profile of iron. Note that in FIG. 10A, the concentration of iron is illustrated as being constant in the buffer layer 23 and the electron transit layer 24 in order to simplify the explanation.

Meanwhile, FIG. 10B is a schematic diagram illustrating kinetic energy of electrons when the compound semiconductor device 50 is in the on-state, in the case where iron is distributed as illustrated in FIG. 10A.

As illustrated in FIG. 10B, in the compound semiconductor device 50 in the on-state, a high voltage at several tens of volts is applied between the source electrode 40a and the drain electrode 40b. Therefore, the kinetic energy of the electrons becomes extremely high, such as about 10000 K by temperature.

FIG. 11 is a schematic diagram illustrating a relation between the kinetic energy of the electrons and a scattering frequency of the electrons.

As illustrated in FIG. 11, optical phonon scattering and impurity scattering are factors for the electron scattering.

Then, in the case where the kinetic energy of the electrons is high, the optical phonon scattering is dominant over the impurity scattering.

As a consequence, when the kinetic energy of the electrons is high as illustrated in FIG. 10B, the electrons are hardly subjected to the impurity scattering caused by iron even when the electron transit layer 24 is doped with the iron, and the electron mobility does not significantly decreases.

Second Embodiment

In the present embodiment, a description will be given of a concentration profile of iron, which is effective for preventing holes generated by collision ionization from reaching a deep portion of a device.

Figure 12:
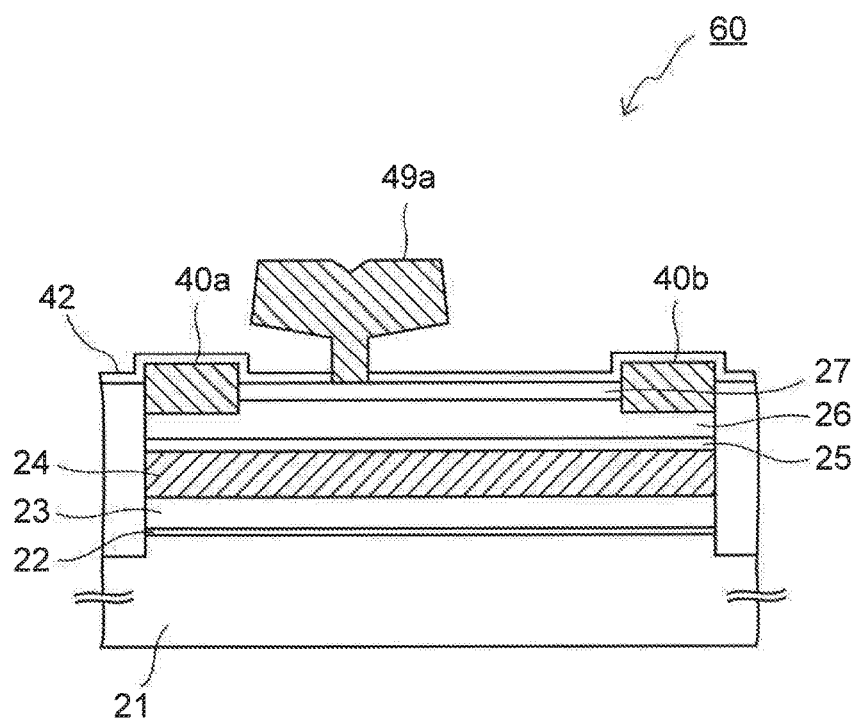
FIG. 12 is a cross-sectional view of a compound semiconductor device according to a second embodiment.

FIG. 12 is a cross-sectional view of a compound semiconductor device of the present embodiment.

Each layer in a compound semiconductor device 60 are formed in a similar manner to those in the first embodiment, and detailed description thereof will be omitted.

Figure 13:
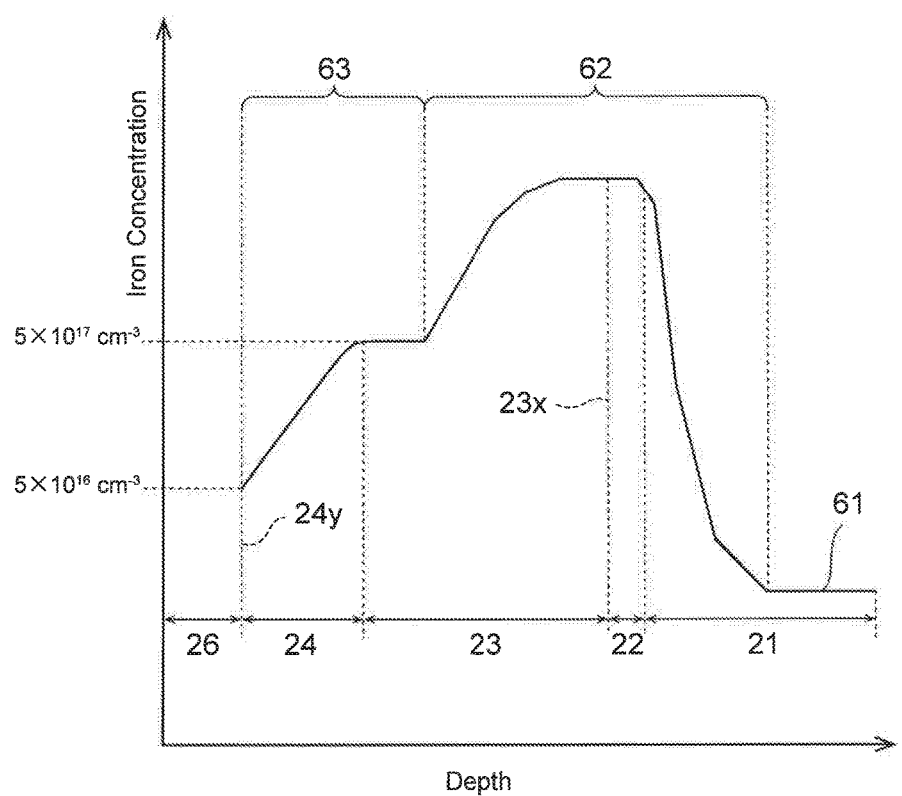
FIG. 13 is a diagram illustrating a concentration profile of iron in the compound semiconductor device according to the second embodiment.

FIG. 13 is a diagram illustrating a concentration profile of iron in the compound semiconductor device 60.

Note that the intermediate layer 25 is omitted in FIG. 13 in order to simplify the explanation.

As illustrated in FIG. 13, a concentration profile 61 includes a first profile 62 located close to the substrate 21 and a second profile 63 located close to the barrier layer 26.

Of these profiles, the first profile 62 is a profile which has a peak at a lower surface 23x of the buffer layer 23.

Since no channel is formed in the vicinity of the lower surface 23x, the electron mobility in the channel does not decrease even by increasing the concentration of iron at the lower surface 23x in this manner.

Moreover, by increasing the concentration of iron at the lower surface 23x, the holes generated by the collision ionization can certainly be trapped by the trap level of iron located in the vicinity of the lower surface 23x. As a consequence, it is possible to prevent the conduction band from being put downward at the lower surface 23x due to the holes, and to effectively inhibit the electrons from flowing through a deep portion of the electron transit layer 24.

Especially, the holes can be efficiently trapped in the vicinity of the lower surface 23x by increasing the concentration of iron at the lower surface 23x over $5 \times 10^{17}$ cm$^{-3}$.

Meanwhile, the second profile 63 is a profile for slightly doping iron into the upper surface 24y of the electron transit layer 24. Therefore, a peak concentration of iron in the second profile 63 is lower than the peak concentration of the first profile 62.

By lowering the peak concentration in the second profile 63 in this manner, it is possible to trap the holes generated in the vicinity of the upper surface 24y by the trap level of iron, while preventing the mobility of the electrons flowing in the channel in the vicinity of the upper surface 24y from decreasing due to the iron.

The concentration of iron at the upper surface 24y is not particularly limited. However, when the concentration is too low, the trap level for trapping the holes becomes insufficient. Therefore, it is preferable to set the concentration at the upper surface 24y equal to or greater than $5 \times 10^{16}$ cm$^{-3}$.

Here, when the kinetic energy of the electrons is high, the decrease in mobility due to iron is not significant as explained with reference to FIG. 10B in the first embodiment. However, the mobility decrease cannot be ignored when the concentration of iron becomes too high. Accordingly, it is preferable to set the concentration of iron at the upper surface 24y below $5 \times 10^{17}$ cm$^{-3}$.

The forms of the first profile 62 and the second profile 63 can be obtained by adjusting flow rates of cyclopentadienyl iron to be added to the deposition gases for the buffer layer 23 and the electron transit layer 24. For example, the first profile 62 may be formed by supplying a high flow rate of cyclopentadienyl iron to the deposition gas, and then the second profile 63 may be formed by reducing the flow rate of cyclopentadienyl iron.

Moreover, the forms of the respective profiles 62 and 63 become broad as a result of diffusion of iron into the buffer layer 23 and the electron transit layer 24.

In order to confirm that the current collapse phenomenon is suppressed in the present embodiment, the inventor of the present application measured three-terminal characteristics of the compound semiconductor device 60 of the present embodiment.

A result of measurement will be described with reference to FIGS. 14A and 14B.

Figure 14A:
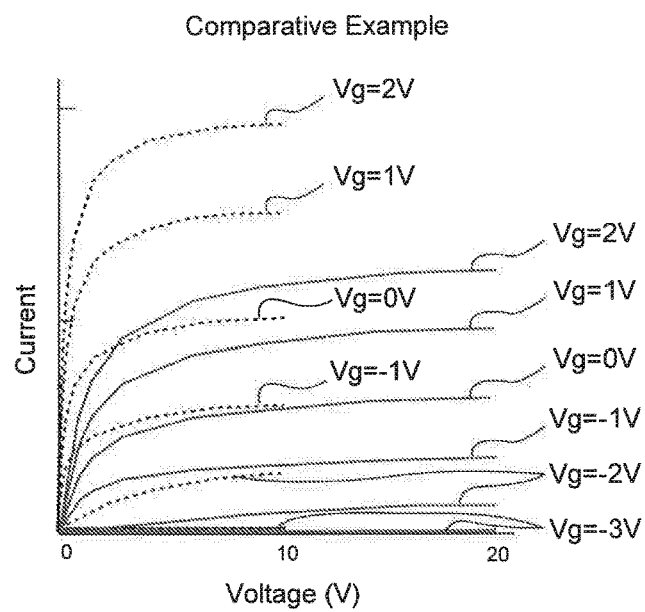
FIG. 14A is a diagram obtained by measuring three-terminal characteristics of the compound semiconductor device according to the comparative example.
Figure 14B:
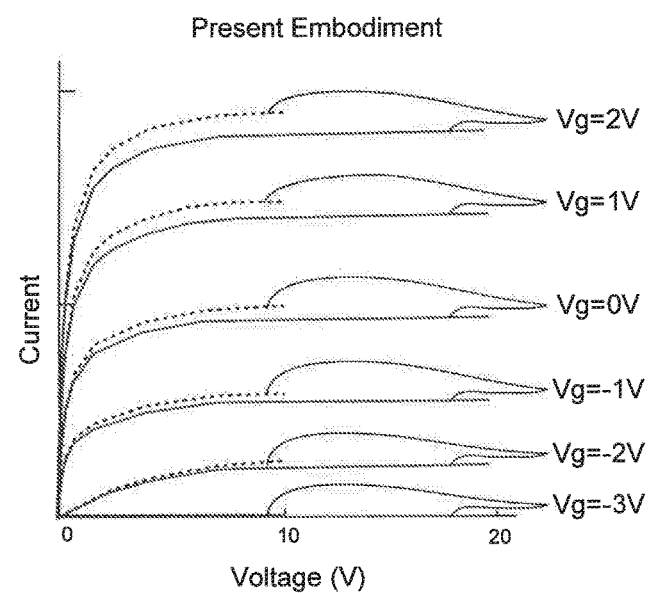
FIG. 14B is a diagram obtained by measuring three-terminal characteristics of the compound semiconductor device according to the second embodiment.

Note that the meanings of the vertical axes and the horizontal axes in FIGS. 14A and 14B are the same as those in FIGS. 6A and 6B in the first embodiment, and description thereof will be omitted.

FIG. 14A is a diagram obtained by using the compound semiconductor device 1 in FIG. 1 as the comparative example and measuring three-terminal characteristics of the comparative example.

As illustrated in FIG. 14A, when comparing with the same gate voltage Vg, on-resistance and a maximum current in the case where the source-drain voltage is raised to 20 V (solid lines) are smaller than those in the case where the source-drain voltage is raised to 10 V (dotted lines), which indicates that current collapse phenomenon occurs in the comparative example.

Meanwhile, FIG. 14B is a diagram obtained by measuring three-terminal characteristics of the compound semiconductor device 60 of this embodiment.

As illustrated in FIG. 14B, when comparing with the same gate voltage Vg, on-resistance and a maximum current in the case where the source-drain voltage is raised to 20 V (solid lines) are substantially equal to those in the case where the source-drain voltage is raised to 10 V (dotted lines) in the present embodiment, which indicates that the current collapse phenomenon is suppressed.

According to this result, it was confirmed that the current collapse phenomenon was also suppressed in the present embodiment.

In the meantime, in order to confirm that the short-channel effect is suppressed in the present embodiment, the inventor of the present application investigated a relation between a gate-source voltage Vgs and a drain current Ids of the compound semiconductor device 60.

Figure 15:
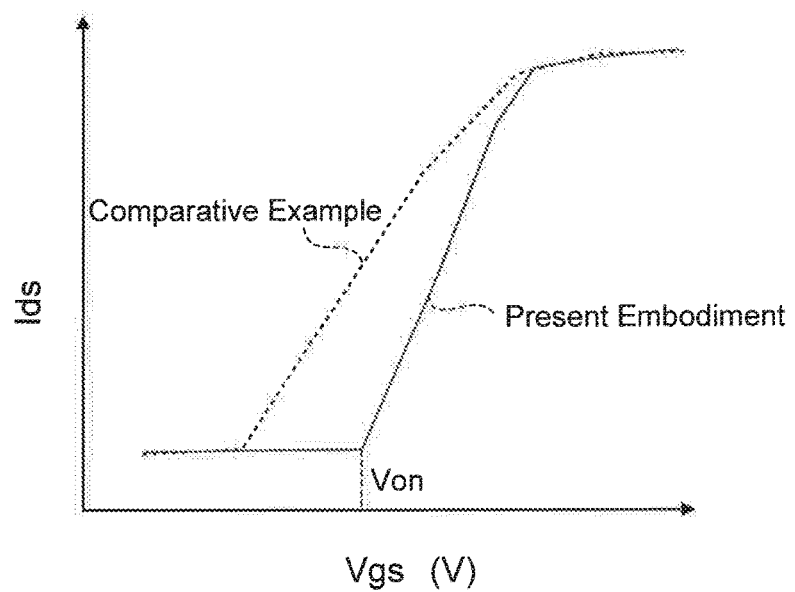
FIG. 15 is a graph obtained by investigating a relation between a gate-source voltage and a drain current of the compound semiconductor device according to the second embodiment.

FIG. 15 is a graph obtained by the investigation.

Note that in FIG. 15, the compound semiconductor device 1 in FIG. 1 is used as the comparative example, and the relation between the gate-source voltage Vgs and the drain current Ids of the comparative example is also indicated.

As illustrated in FIG. 15, it was confirmed that in the present embodiment, a voltage Von at which the transistor becomes an on-state is higher than that in the comparative example, and short-channel effect is suppressed.

Third Embodiment

Next, a compound semiconductor device according to a third embodiment will be described while illustrating a manufacturing process thereof.

FIGS. 16A to 16D are cross-sectional views in the process of manufacturing the compound semiconductor device of the present embodiment.

Note that in FIGS. 16A to 16D, the same elements as those described in the first embodiment will be denoted by the same reference numerals as in the first embodiment, and explanations thereof will be omitted in the following.

Figure 16A:
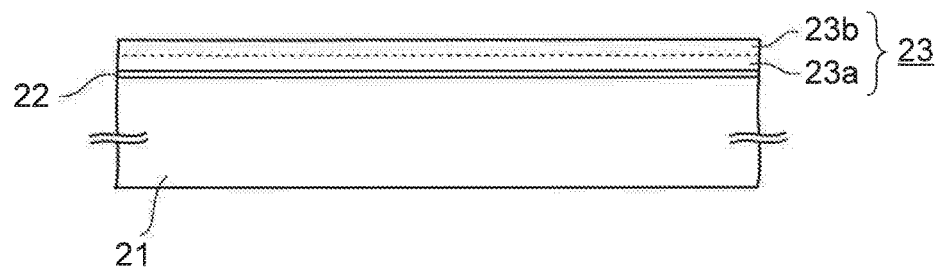
FIGS. 16A to 16D are cross-sectional views in the process of manufacturing a compound semiconductor device according to a third embodiment.

First, as illustrated in FIG. 16A, the nucleation layer 22 and the buffer layer 23 are formed in this order by the MOVPE on the substrate 21, by performing the processes described with reference to FIGS. 4A and 4B in the first embodiment.

However, in the present embodiment, the buffer layer 23 is formed by providing a lower portion 23a having a low concentration of iron and an upper portion 23b having a high concentration of iron, while changing the flow rate of cyclopentadienyl iron in the middle of deposition of the buffer layer 23.

The thickness and the concentration of iron of these portions are not particularly limited. For example, a thickness of the lower portion 23a is set in a range from 500 nm to 1000 nm, and the concentration of iron in the lower portion 23a is set to about $5 \times 10^{17}$ cm$^{-3}$. Meanwhile, a thickness of the upper portion 23b is set in a range from 500 nm to 1000 nm, and the concentration of iron in the upper portion 23b is set to about $2 \times 10^{18}$ cm$^{-3}$.

Figure 16B:
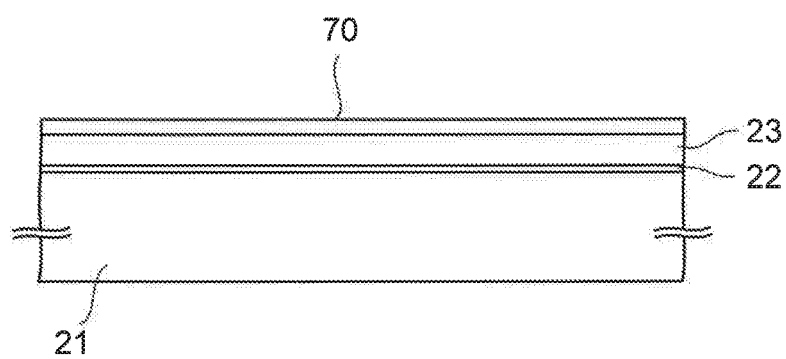

Next, as illustrated in FIG. 16B, an AlN layer is formed to a thickness of about 2 nm as a compound semiconductor layer 70 on the buffer layer 23 by the MOVPE method.

Figure 16C:
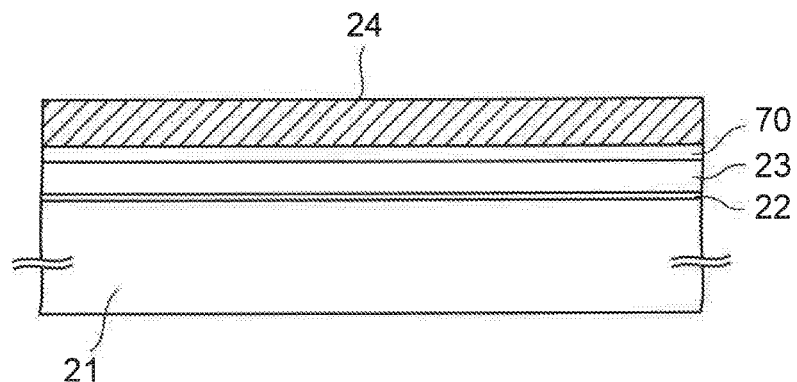

Subsequently, as illustrated in FIG. 16C, a GaN layer is formed to a thickness of about 100 nm as the electron transit layer 24 on the compound semiconductor layer 70 by the MOVPE method while using a mixed gas of TMG gas, ammonia gas, and hydrogen gas as a deposition gas.

As in the first embodiment, cyclopentadienyl iron is added to the deposition gas. Thus, the electron transit layer 24 is doped with iron at a concentration of about $5 \times 10^{16}$ cm$^{-3}$.

Figure 16D:
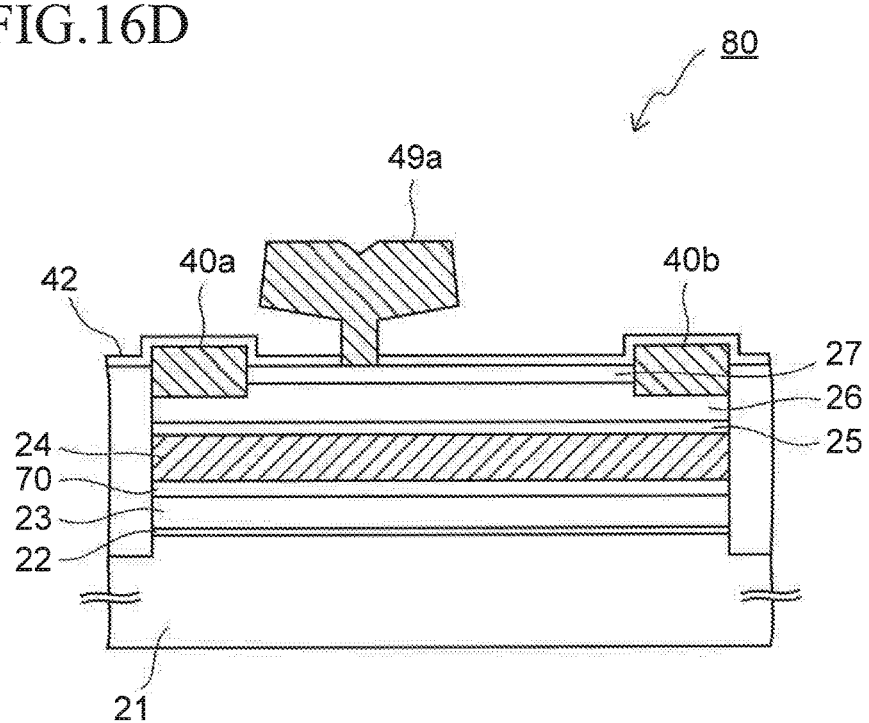

Thereafter, the processes in FIGS. 4D to 4P described in the first embodiment are carried out to complete a basic structure of a compound semiconductor device 80 of the present embodiment illustrated in FIG. 16D.

Figure 17:
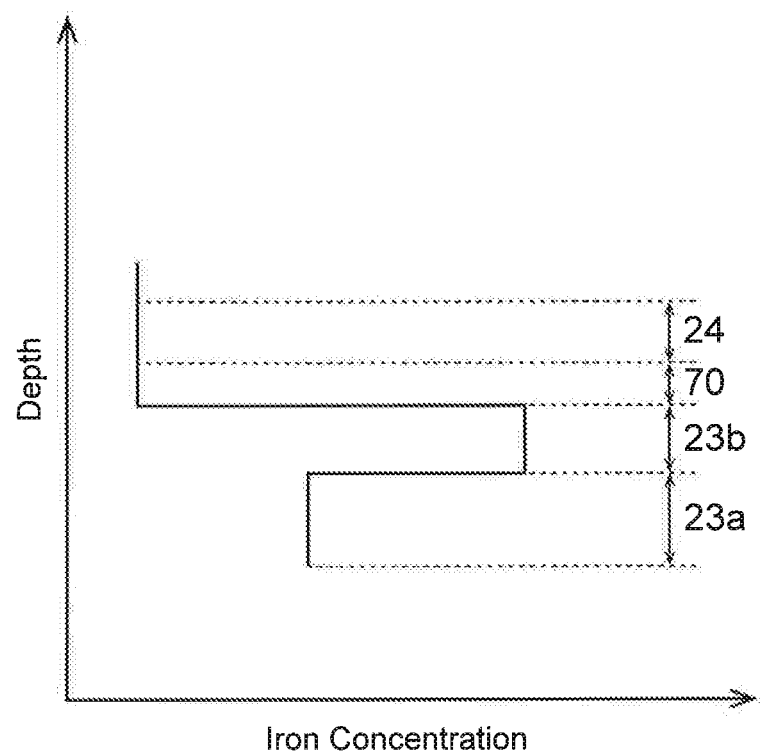
FIG. 17 is a diagram illustrating a concentration profile of iron in the compound semiconductor device according to the third embodiment.

FIG. 17 is a diagram illustrating a concentration profile of iron in the compound semiconductor device 80.

As illustrated in FIG. 17, the concentration of iron marks a peak at the upper portion 23b of the buffer layer 23 in the present embodiment.

Figure 18:
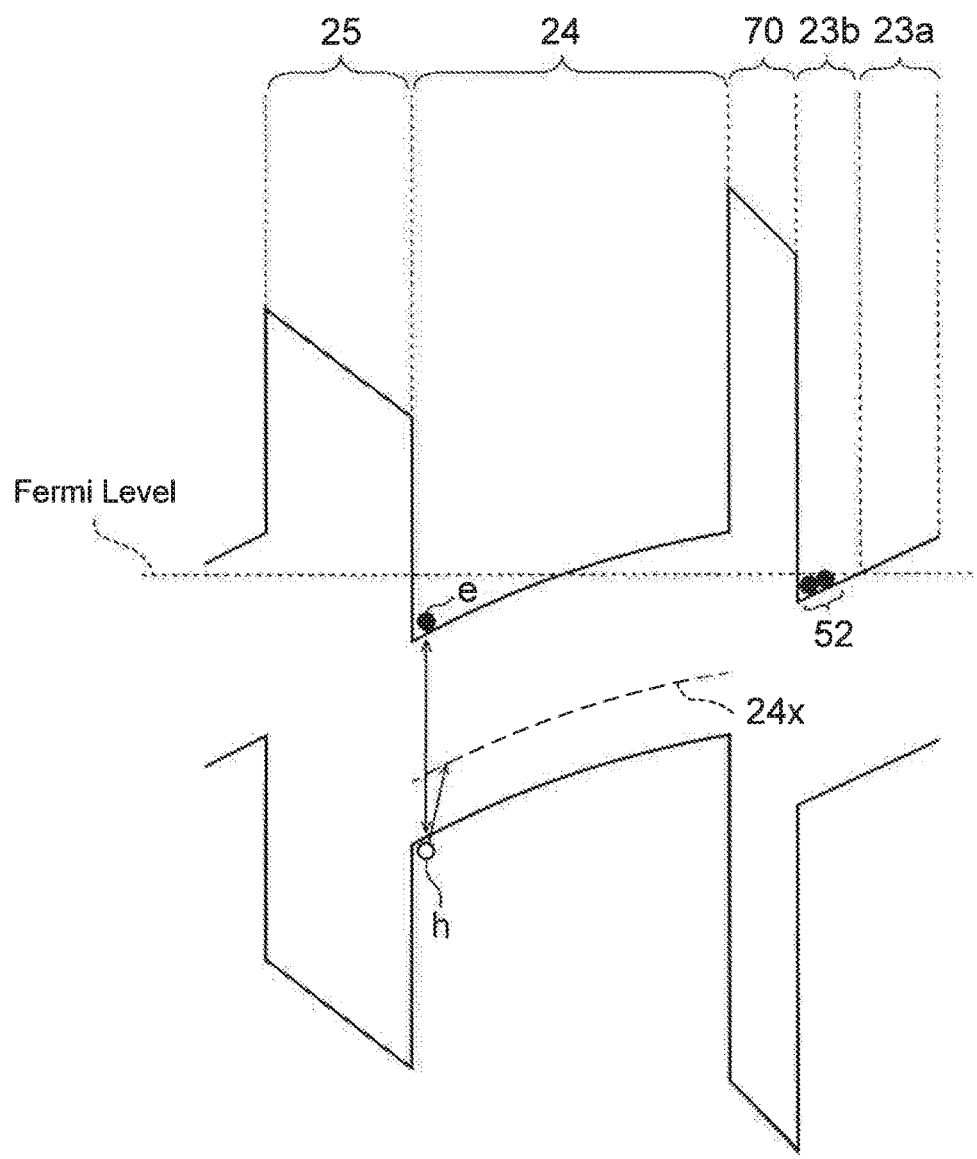
FIG. 18 is a diagram illustrating a band structure of the compound semiconductor device according to the third embodiment.

FIG. 18 is a diagram illustrating a band structure of the compound semiconductor device 80.

As illustrated in FIG. 18, the AlN layer formed as the compound semiconductor layer 70 has a conduction band higher than that of the GaN layer formed as the electron transit layer 24.

Therefore, a barrier is formed between the electron transit layer 24 and the compound semiconductor layer 70, and electrons e are less likely to flow toward the substrate 21. Accordingly, it is possible to reduce a leakage current flowing between the source electrode 40a and the drain electrode 40b, and thus to suppress occurrence of the short-channel effect.

Moreover, the electron trap is less likely to be generated in the AlN layer formed as the compound semiconductor layer 70 as compared to the AlGaN layer to be used for the back barrier layer. Therefore, the compound semiconductor layer 70 is prevented from being charged up due to the electrons trapped by the electron trap, and the conduction band can be prevented from being raised by the charge-up. As a consequence, a decrease in electron concentration due to the raised conduction band is suppressed, which in turn makes it possible to suppress the current collapse phenomenon.

In addition, since the electron transit layer is doped with iron, the holes h generated by the collision ionization are trapped by the trap level 24x of iron. As a result, it is possible to inhibit the conduction band in the electron transit layer 24 from being put downward by the holes h. Accordingly, the electrons e are less likely to flow on the deep portion of the electron transit layer 24, and the short-channel effect can be suppressed.

Here, piezoelectric polarization or spontaneous polarization are generated in the compound semiconductor layer 70 due to the difference in lattice constant between the buffer layer 23 and the compound semiconductor layer 70, which in turn generates a two-dimensional electron gas 52 in the upper portion 23b of the buffer layer 23.

In the present embodiment, the concentration of iron in the upper portion 23b is higher than that of the lower portion 23a as illustrated in FIG. 17, and the iron functions as compensating ions. Thus, the unnecessary two-dimensional electron gas 52 generated in the upper portion 23b can be annihilated by the compensating ions.

In order to confirm that a current collapse phenomenon is suppressed in the present embodiment, the inventor of the present application measured three-terminal characteristics of the compound semiconductor device 80 of the present embodiment.

A result of measurement will be described with reference to FIGS. 19A and 19B.

Figure 19A:
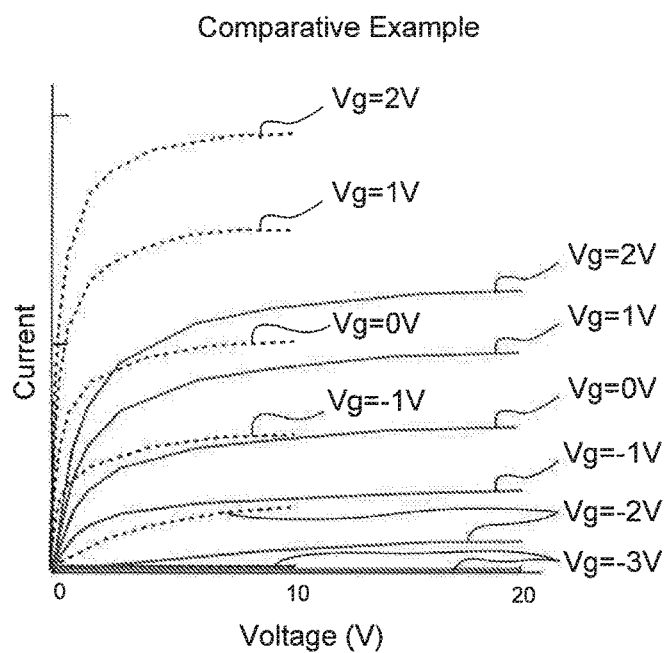
FIG. 19A is a diagram obtained by measuring the three-terminal characteristics of the compound semiconductor device according to the comparative example.
Figure 19B:
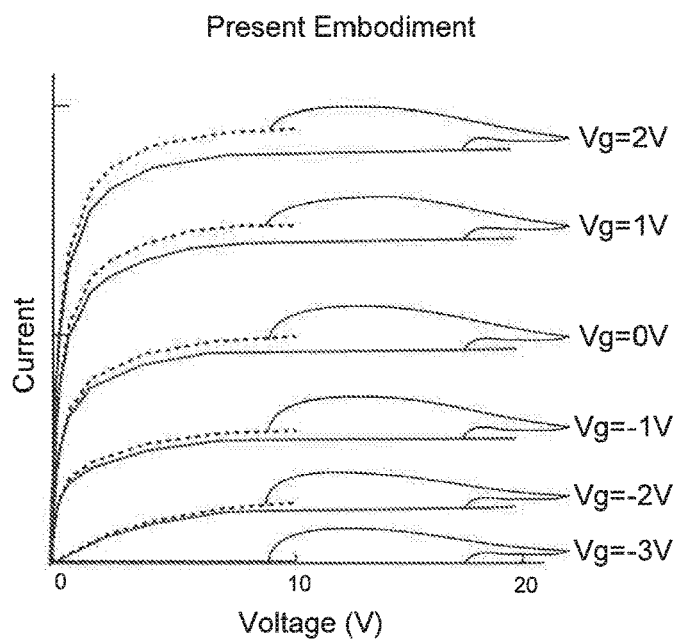
FIG. 19B is a diagram obtained by measuring three-terminal characteristics of the compound semiconductor device according to the third embodiment.

Note that the meanings of the vertical axes and the horizontal axes in FIGS. 19A and 19B are the same as those in FIGS. 6A and 6B of the first embodiment, and description thereof will be omitted.

FIG. 19A is a diagram obtained by using the compound semiconductor device 1 in FIG. 1 as the comparative example and measuring three-terminal characteristics of the comparative example.

As illustrated in FIG. 19A, when comparing with the same gate voltage Vg, on-resistance and a maximum current in the case where the source-drain voltage is raised to 20 V (solid lines) are smaller than those in the case where the source-drain voltage is raised to 10 V (dotted lines), which indicates that current collapse phenomenon occurs in the comparative example.

Meanwhile, FIG. 19B is a diagram obtained by measuring three-terminal characteristics of the compound semiconductor device 80 of the present embodiment.

As illustrated in FIG. 19B, when comparing with the same gate voltage Vg, on-resistance and a maximum current in the case where the source-drain voltage is raised to 20 V (solid lines) are substantially equal to those in the case where the source-drain voltage is raised to 10 V (dotted lines) in the present embodiment, which indicates that the current collapse phenomenon is suppressed.

According to these results, it was confirmed that the current collapse phenomenon is suppressed in the present embodiment.

In the meantime, in order to confirm that the short-channel effect is suppressed in the present embodiment, the inventor of the present application investigated a relation between a gate-source voltage Vgs and a drain current Ids of the compound semiconductor device 80 of the present embodiment.

Figure 20:
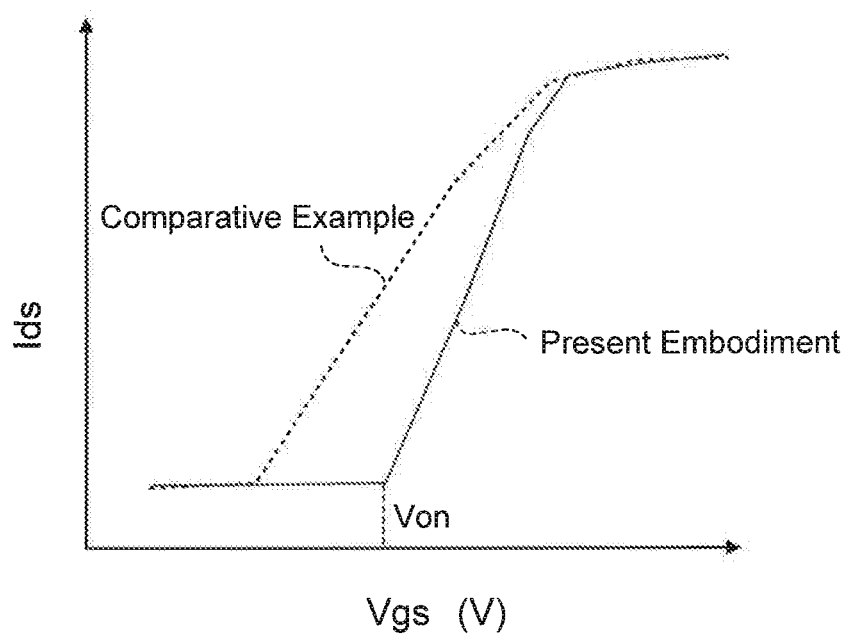
FIG. 20 is a graph obtained by investigating a relation between a gate-source voltage and a drain current of the compound semiconductor device according to the third embodiment.

FIG. 20 is a graph obtained by the investigation.

Note that in FIG. 20, the compound semiconductor device 1 of FIG. 1 is used as the comparative example, and the relation between the gate-source voltage Vgs and the drain current Ids of the comparative example is also indicated.

As illustrated in FIG. 20, it was confirmed that in the present embodiment, a voltage Von at which the transistor becomes an on-state is higher than that in the comparative example, and short-channel effect is suppressed.

Fourth Embodiment

Next, a compound semiconductor device according to a fourth embodiment will be described while illustrating a manufacturing process thereof.

FIGS. 21A to 21G are cross-sectional views in the process of manufacturing the compound semiconductor device of the present embodiment.

Note that in FIGS. 21A to 21G, the same elements as those described in the first embodiment will be denoted by the same reference numerals as in the first embodiment and explanations thereof will be omitted in the following.

Figure 21A:
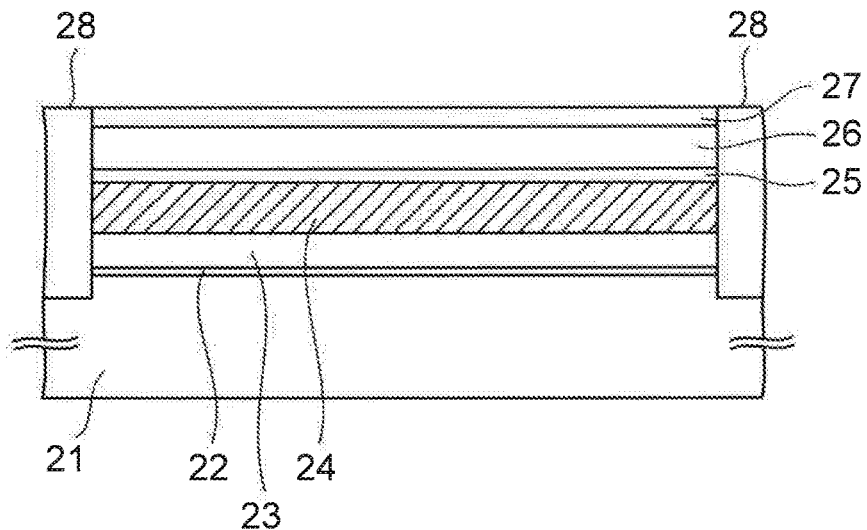
FIGS. 21A to 21G are cross-sectional views in the process of manufacturing a compound semiconductor device according to a fourth embodiment.

First, as illustrated in FIG. 21A, the nucleation layer 22, the buffer layer 23, the electron transit layer 24, the intermediate layer 25, the barrier layer 26, and the cap layer 27 are formed in this order on the substrate 21 by conducting the processes described with reference to FIGS. 4A and 4F in the first embodiment.

Figure 21B:
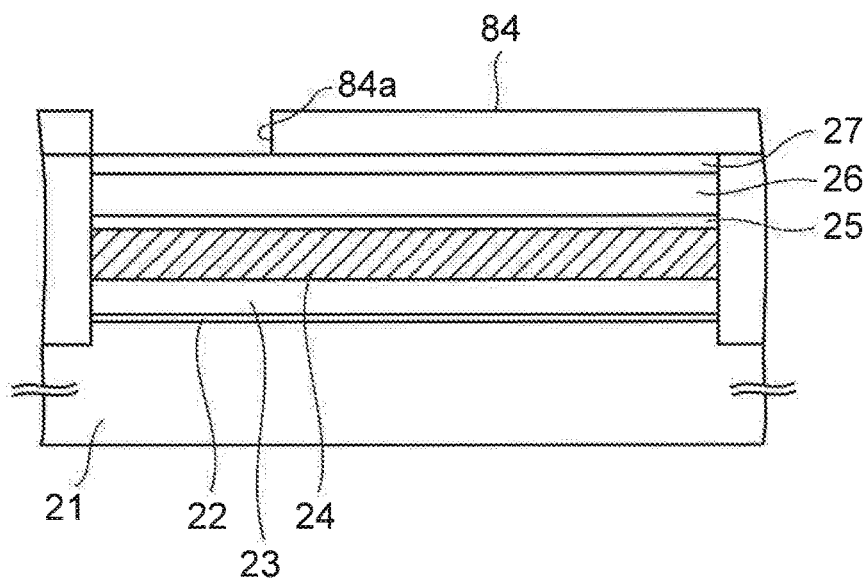

Next, as illustrated in FIG. 21B, a silicon oxide layer is formed as a mask layer 84 on the cap layer 27 by CVD method. Moreover, the mask layer 84 is subjected to patterning to form an opening 84a.

Figure 21C:
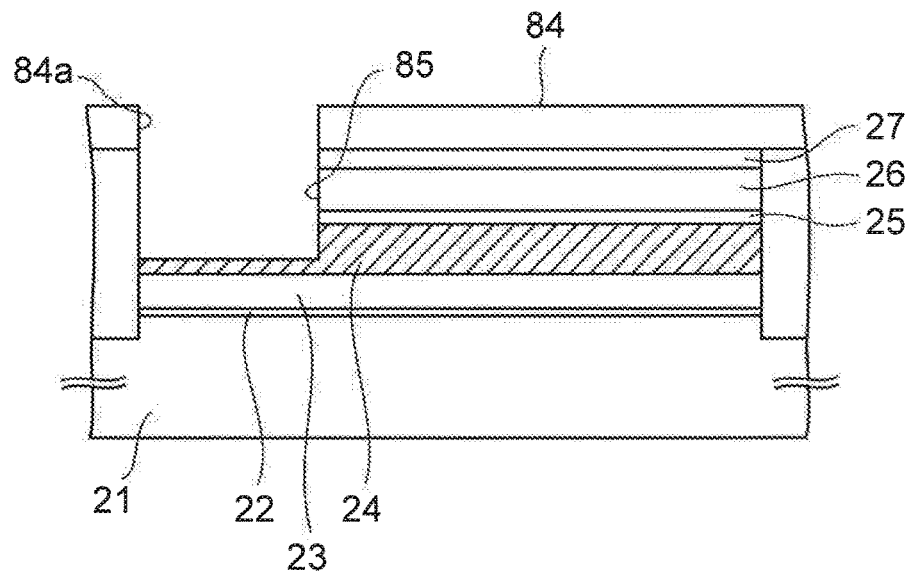

Subsequently, as illustrated in FIG. 21C, the electron transit layer 24, the intermediate layer 25, the barrier layer 26, and the cap layer 27 are subjected to dry etching through the opening 84a respectively, and a recess 85 is formed to reach a halfway depth of the electron transit layer 24.

Figure 21D:
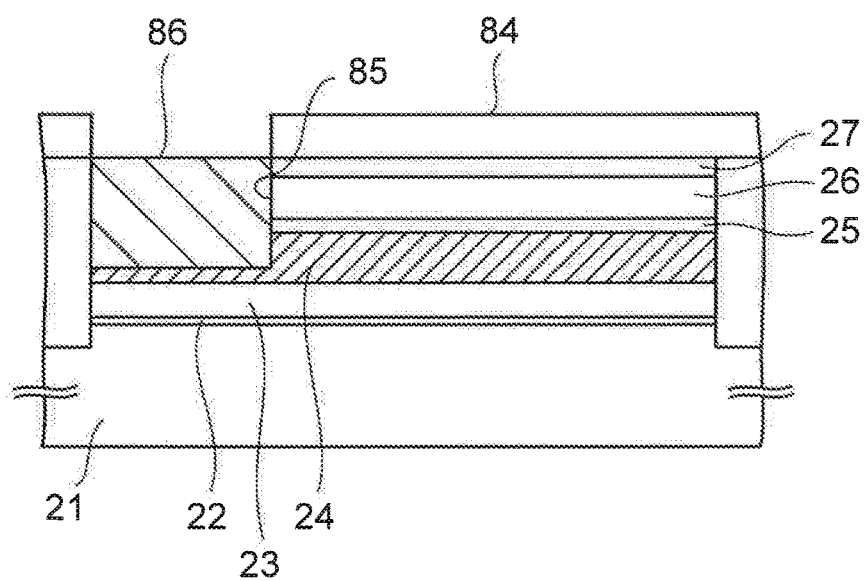

Subsequently, as illustrated in FIG. 21D, an n$^+$-type GaN layer is regrown as a contact layer 86 in the recess 85 by the MOVPE method. Silicon is an example of the doped impurity for making the GaN layer into the n$^+$-type.

Thereafter, the mask layer 84 is removed.

Figure 21E:
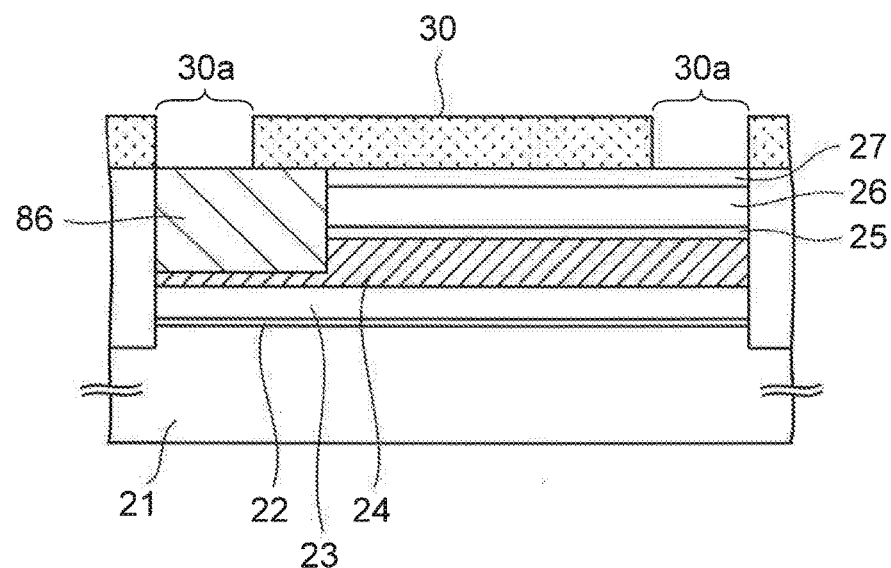

Then, as illustrated in FIG. 21E, the first resist layer 30 is coated on the cap layer 27, and the two openings 30a are formed at a distance from each other in the first resist layer 30 by performing exposure and development for the first resist layer 30.

One of the openings 30a is formed over the contact layer 86. Meanwhile, the other opening 30a is formed over a portion of the cap layer 27 at a distance from the contact layer 86.

Figure 21F:
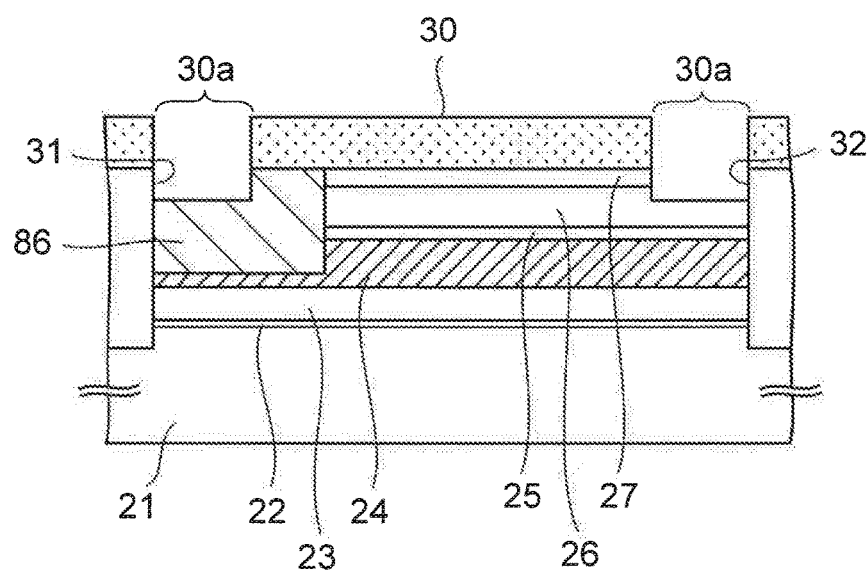

Next, as illustrated in FIG. 21F, the contact layer 86 is subjected to dry etching through the one opening 30a. Thus, the first opening 31 reaching a halfway depth of the contact layer 86 is formed. At the same time, a part of the barrier layer 26 and the cap layer 27 are subjected to dry etching through the other opening 30a, respectively. Thus, the second opening 32 reaching a halfway depth of the barrier layer 26 is formed.

An etching gas used in this dry etching is not particularly limited. For example, a mixed gas of an inert gas and chlorine gas may be used as the etching gas.

Then, the first resist layer 30 is removed.

Figure 21G:
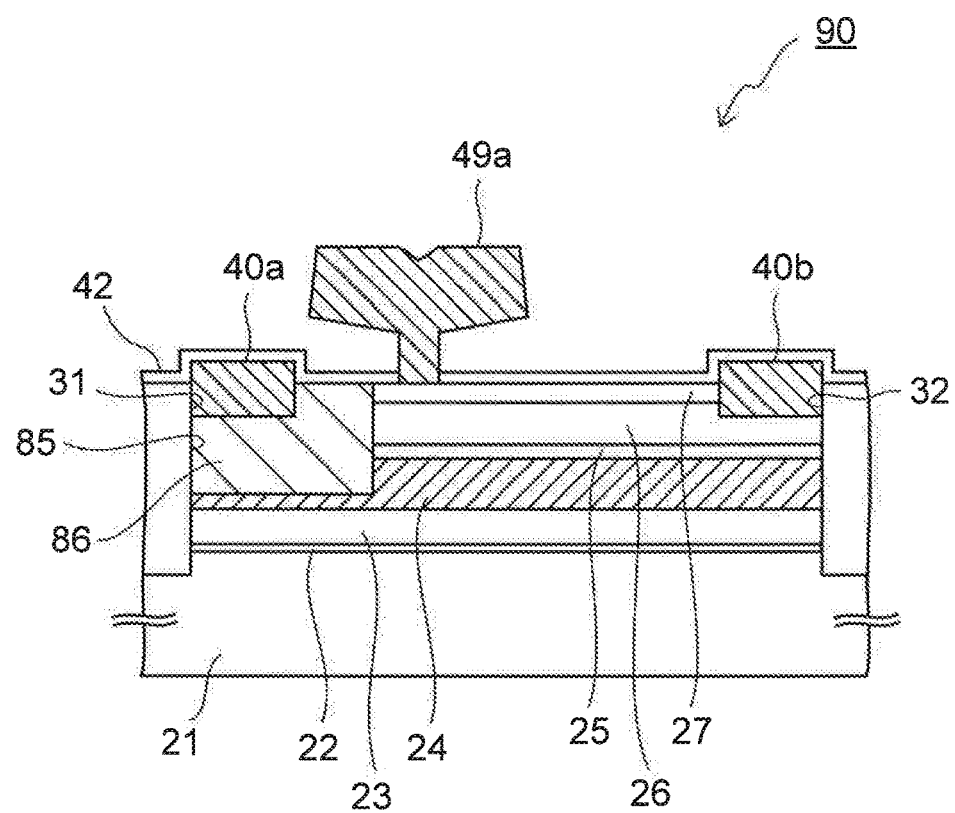

Thereafter, the processes illustrated in FIGS. 4I to 4P described in the first embodiment are carried out to complete a basic structure of a compound semiconductor device 90 of the present embodiment illustrated in FIG. 21G.

According to the present embodiment, the recess 85 is provided in the electron transit layer 24 located below the source electrode 40a, and the contact layer 86 is formed in the recess 85.

Since electric field does not concentrate in the vicinity of the source electrode 40a, the effect of suppressing the short-channel effect is maintained even when the recess 85 is formed in the iron-doped electron transit layer 24 in this manner. Moreover, since the n$^+$-type GaN layer having low resistance is formed as the contact layer 86, contact resistance between the source electrode 40a and the electron transit layer 24 can also be reduced.

On the other hand, concentration of electric fields occurs in the vicinity of the drain electrode 40b. Accordingly, it is preferable to suppress the short-channel effect with the doped iron in the electron transit layer 24, without forming a recess in a portion of the electron transit layer 24 located below the drain electrode 40b.

Fifth Embodiment

In the present embodiment, a description will be given of a discrete package provided with any of the compound semiconductor devices 50, 60, 80, and 90 manufactured in accordance with the first to fourth embodiments.

Figure 22:
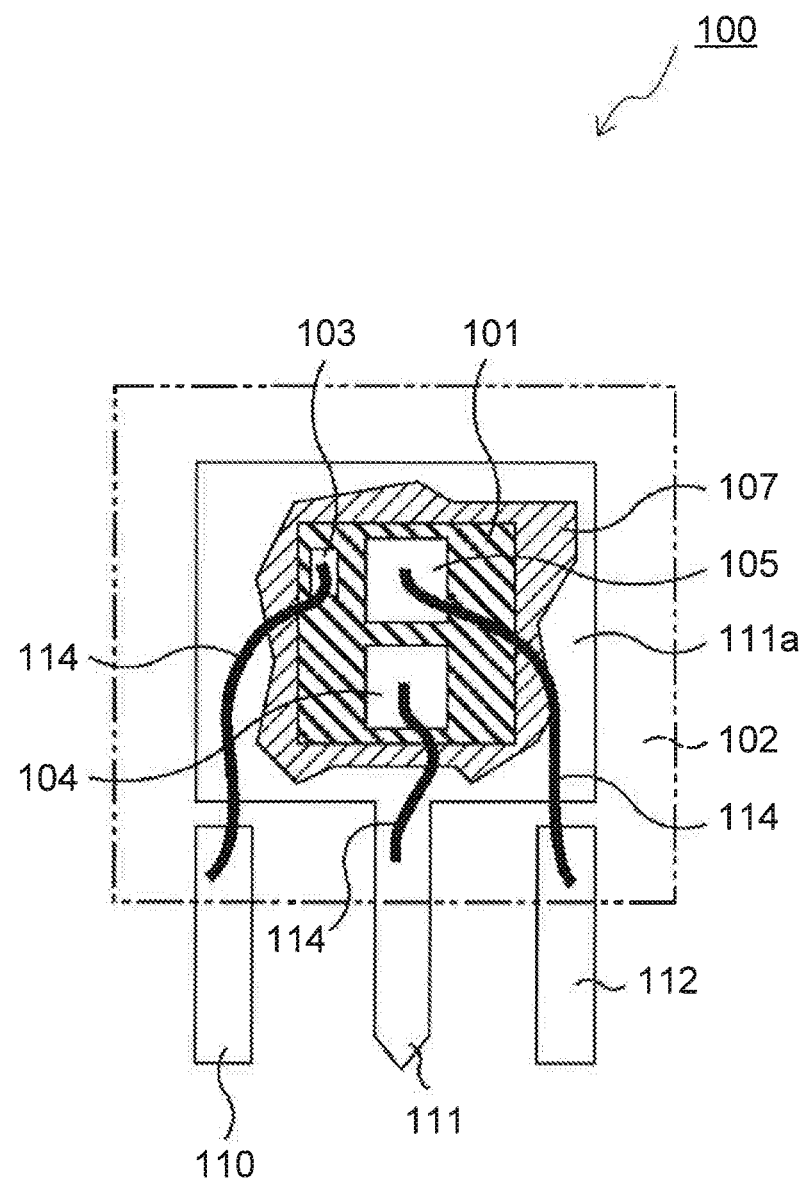
FIG. 22 is a plan view of a discrete package according to a fifth embodiment.

FIG. 22 is a plan view of the discrete package of the present embodiment.

This discrete package 100 is provided with a HEMT chip 101 including one of the compound semiconductor devices 50, 60, 80, and 90 described in the first to fourth embodiments, and a resin 102 to seal the HEMT chip 101.

The HEMT chip 101 is provided with a gate pad 103, a drain pad 104, and a source pad 105. These pads are electrically connected to the gate electrode 49a, the drain electrode 40b, and the source electrode 40a, respectively through unillustrated wires.

Meanwhile, a gate lead 110, a drain lead 111, and a source lead 112 are partially buried in the resin 102. Among them, the drain lead 111 is provided with a square-shaped land 111a and the HEMT chip 101 is attached to the land 111a by a die-attach material 107.

Then, the leads 110, 111, and 112 are electrically connected to the gate pad 103, the drain pad 104, and the source pad 105, respectively through metal wires 114 such as aluminum wires.

According to the present embodiment, the short-channel effect in the HEMT chip 101 is suppressed. Therefore, it is possible to provide the discrete package 100 suitable for use in a high-frequency application.

Sixth Embodiment

In this embodiment, a description will be given of a power factor correction (PFC) circuit using the HEMT chip 101 of the fifth embodiment.

Figure 23:
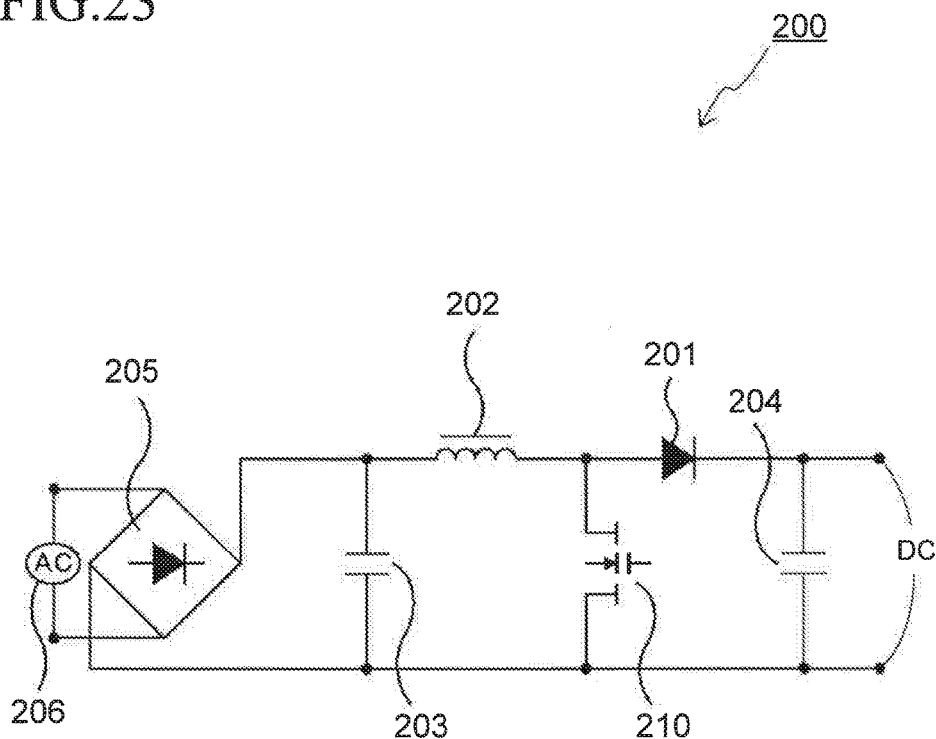
FIG. 23 is a circuit diagram of a PFC circuit according to a sixth embodiment.

FIG. 23 is a circuit diagram of the PFC circuit.

As illustrated in FIG. 23, a PFC circuit 200 includes a diode 201, a choke coil 202, capacitors 203 and 204, a diode bridge 205, an alternating-current power supply 206, and a switching element 210.

Among them, as the switching element 210, the HEMT chip 101 described in the fifth embodiment may be used. A drain electrode of the switching element 210 is connected to an anode terminal of the diode 201 and to one of terminals of the choke coil 202.

Meanwhile, a source electrode of the switching element 210 is connected to one of terminals of the capacitor 203 and to one of terminals of the capacitor 204.

Here, an unillustrated gate driver is connected to a gate electrode of the switching element 210.

Moreover, the other terminal of the capacitor 203 is connected to the other terminal of the choke coil 202, and the other terminal of the capacitor 204 is connected to a cathode terminal of the diode 201.

Then, the alternating-current power supply 206 is connected between the both terminals of the capacitor 203 through the diode bridge 205, while a direct-current power supply DC is connected between the both terminals of the capacitor 204.

Seventh Embodiment

In the present embodiment, a description will be given of a power supply unit using the HEMT chip 101 of the fifth embodiment.

Figure 24:
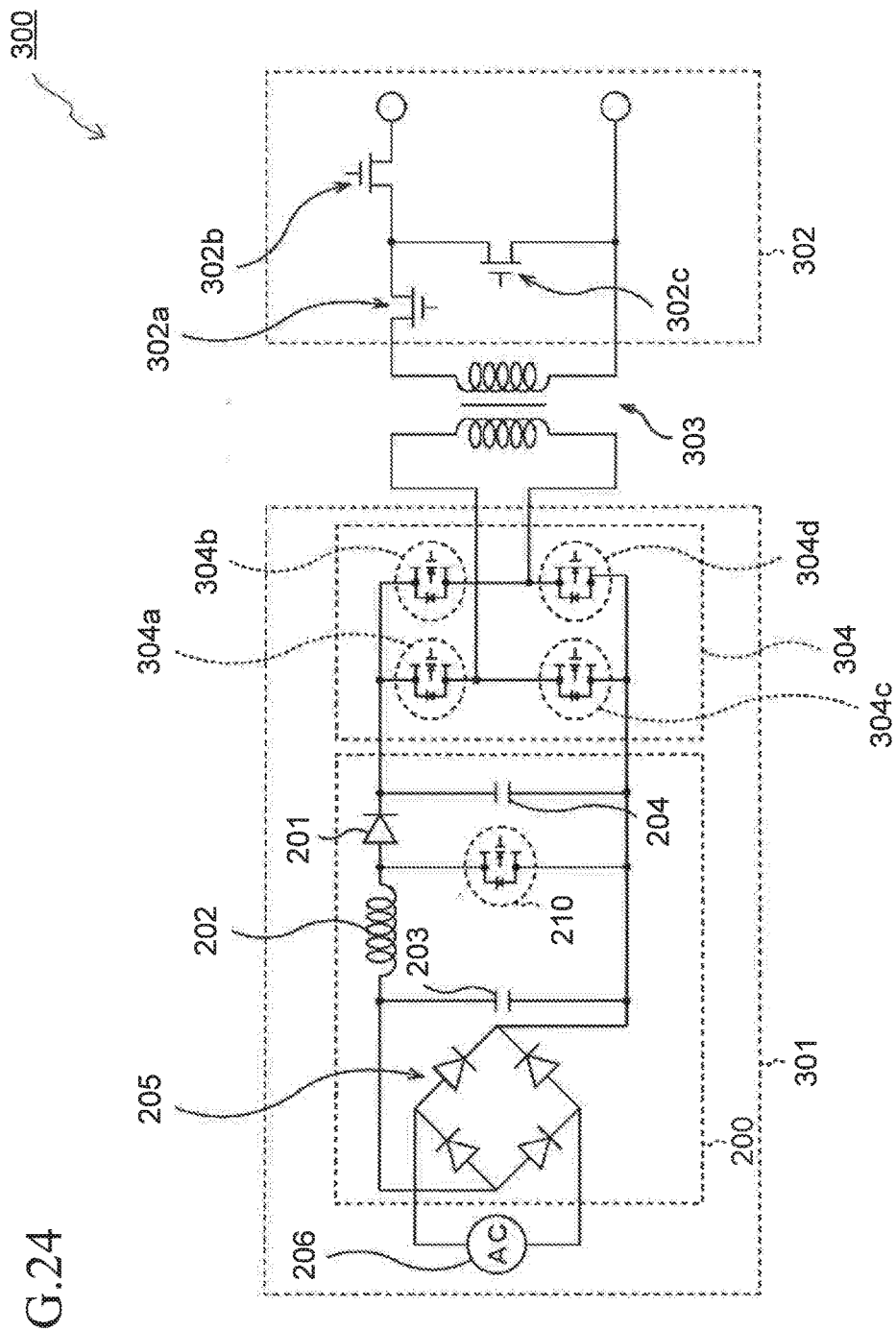
FIG. 24 is a circuit diagram of a power supply unit according to a seventh embodiment.

FIG. 24 is a circuit diagram of the power supply unit. Note that in FIG. 24, the same elements as those described in the fifth embodiment will be denoted by the same reference numerals as in the fifth embodiment, and explanations thereof will be omitted in the following.

As illustrated in FIG. 24, a power supply unit 300 includes a high-voltage primary circuit 301, a low-voltage secondary circuit 302, and a transformer 303 connected therebetween.

Among them, the primary circuit 301 is provided with the PFC circuit 200 described in the fifth embodiment, and a full bridge inverter circuit 304 connected between the terminals of the capacitor 204 of the PFC circuit 200.

The full bridge inverter circuit 304 includes four switching elements 304a, 304b, 304c, and 304d. The HEMT chip 101 described in the fifth embodiment may be used as each of the switching elements 304a, 304b, 304c, and 304d.

On the other hand, the secondary circuit 302 includes three switching elements 302a, 302b, and 302c. For example, each of the switching elements 302a, 302b, and 302c may be a metal insulator semiconductor field effect transistor (MISFET) in which a channel is formed on a silicon substrate.

According to the present embodiment, the HEMT chip 101 is used for each of the switching elements 210, 304a, 304b, 304c, and 304d. Since the short-channel effect hardly occurs in the HEMT chip 101, it is possible to provide the power supply unit 300 suitable for a high-frequency application.

Eighth Embodiment

In this embodiment, a description will be given of a high-frequency amplifier using the HEMT chip 101 of the fifth embodiment.

Figure 25:
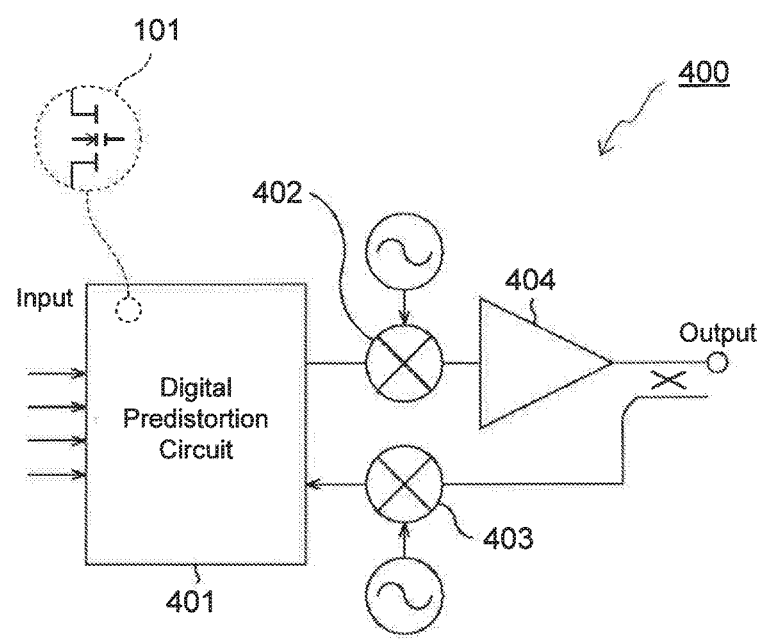
FIG. 25 is a circuit diagram of a high-frequency amplifier according to an eighth embodiment.

FIG. 25 is a circuit diagram of the high-frequency amplifier.

As illustrated in FIG. 25, a high-frequency amplifier 400 includes a digital predistortion circuit 401, mixers 402 and 403, and a power amplifier 404.

Among them, the digital predistortion circuit 401 compensates for non-linear distortion of an inputted signal. Meanwhile, the mixer 402 mixes the inputted signal subjected to compensation for the non-linear distortion with an alternating-current signal.

Meanwhile, the power amplifier 404 includes the HEMT chip 101, and amplifies the inputted signal mixed with the alternating-current signal. Here, in the present embodiment, a signal on an output side may be mixed with the alternating-current signal with the mixer 403 by operating a switch, and the mixed signal thus obtained can be sent out to the digital predistortion circuit 401.

According to the present embodiment, the short-channel effect hardly occurs in the HEMT chip 101 embedded in the power amplifier 404. Thus, it is possible to provide the high-frequency amplifier 400 having a high amplification factor.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:
1. A compound semiconductor device comprising:
a substrate;

an electron transit layer formed on the substrate and made of nitride semiconductor doped with an impurity that forms a trap level;

a barrier layer formed on the electron transit layer; and a source electrode, a drain electrode, and a gate electrode formed over the electron transit layer at a distance from one another, wherein the electron transit layer includes:

a first conductivity type region;

a second conductivity type region located over the first conductivity region, where the second conductivity type region having an electron concentration higher than an electron concentration of the first conductivity type region; and a third conductivity type region located over the second conductivity type region, where the third conductivity type region having an electron concentration lower than a concentration of the impurity and being in contact with an upper surface of the electron transit layer.

2. The compound semiconductor device according to claim 1, wherein the first conductivity type region is any one of a region having the electron concentration equal to or lower than $1\times10^{16}$ cm$^{-3}$ and a region having a concentration of the impurity equal to or greater than $5\times10^{15}$ cm$^{-3}$.

3. The compound semiconductor device according to claim 1, wherein the electron transit layer includes:

a lower portion; and an upper portion formed on the lower portion and having a concentration of the impurity lower than a concentration of the impurity in the lower portion.

4. The compound semiconductor device according to claim 1, wherein a concentration profile of the impurity includes:

a first profile located close to the substrate; and a second profile located close to the barrier layer and having a peak concentration lower than a peak concentration of the first profile.

5. The compound semiconductor device according to claim 4, further comprising:

a buffer layer formed between the substrate and the electron transit layer and doped with the impurity, wherein a peak of the first profile is located at a lower surface of the buffer layer.

6. The compound semiconductor device according to claim 1, further comprising:

a buffer layer formed on the substrate and doped with the impurity; and a compound semiconductor layer formed on the buffer layer and having a conduction band higher than a conduction band of the electron transit layer, wherein the electron transit layer is formed on the compound semiconductor layer.

7. The compound semiconductor device according to claim 6, wherein the buffer layer includes:

a lower portion; and an upper portion formed on the lower portion and having a concentration of the impurity higher than a concentration of the impurity in the lower portion.

8. The compound semiconductor device according to claim 1, further comprising:

a recess formed in the electron transit layer; and a contact layer of compound semiconductor formed in the recess, wherein the source electrode is formed on the contact layer.

9. The compound semiconductor device according to claim 1, wherein a gate length of the gate electrode is equal to or shorter than 120 nm.

10. A power supply unit comprising:

a compound semiconductor device including a substrate, an electron transit layer formed on the substrate and made of nitride semiconductor doped with an impurity that forms a trap level, a barrier layer formed on the electron transit layer, and a source electrode, a drain electrode, and a gate electrode formed over the electron transit layer at a distance form one another, wherein the electron transit layer includes:

a first conductivity type region;

a second conductivity type region located over the first conductivity type region, where the second conductivity type region having an electron concentration higher than an electron concentration of the first conductivity type region; and a third conductivity type region located over the second conductivity type region, where the third conductivity type region having an electron concentration lower than a concentration of the impurity and being in contact with an upper surface of the electron transit layer.

11. An amplifier comprising:

a compound semiconductor device including a substrate, an electron transit layer formed on the substrate and made of nitride semiconductor doped with an impurity that forms a trap level, a barrier layer formed on the electron transit layer, and a source electrode, a drain electrode, and a gate electrode formed over the electron transit layer at a distance form one another, wherein the electron transit layer includes:

a first conductivity type region, a second conductivity type region located over the first conductivity type region, where the second conductivity type region having an electron concentration higher than an electron concentration of the first conductivity type region; and a third conductivity type region located over the second conductivity type region, where the third conductivity type region having an electron concentration lower than a concentration of the impurity and being in contact with an upper surface of the electron transit layer.

* * * * *